(12) United States Patent
Paquette et al.

(10) Patent No.: US 10,301,719 B1
(45) Date of Patent: May 28, 2019

(54) AMORPHOUS HYDROGENATED BORON CARBIDE LOW-K DIELECTRIC AND METHOD OF MAKING THE SAME

(71) Applicant: The Curators of the University of Missouri, Columbia, MO (US)

(72) Inventors: Michelle Paquette, Overland Park, KS (US); Bradley Nordell, Kansas City, MO (US); Anthony N. Caruso, Overland Park, KS (US); Sean King, Hillsboro, OR (US)

(73) Assignees: The Curators of the University of Missouri, Columbia, MO (US); Intel Corporation, Santa Clara, CA (US)

( * ) Notice: Subject to any disclaimer, the term of this patent is extended or adjusted under 35 U.S.C. 154(b) by 0 days.

(21) Appl. No.: 15/092,604

(22) Filed: Apr. 6, 2016

Related U.S. Application Data

(60) Provisional application No. 62/178,320, filed on Apr. 6, 2015, provisional application No. 62/244,538, filed on Oct. 21, 2015.

(51) Int. Cl.
*C23C 16/32* (2006.01)
*C23C 16/505* (2006.01)
(Continued)

(52) U.S. Cl.
CPC .......... *C23C 16/505* (2013.01); *C23C 16/32* (2013.01); *C23C 16/455* (2013.01); *H01L 21/0262* (2013.01); *H01L 21/02365* (2013.01)

(58) Field of Classification Search
None
See application file for complete search history.

(56) References Cited

U.S. PATENT DOCUMENTS

| | | | | |
|---|---|---|---|---|
| 3,398,013 A | * | 8/1968 | Krochmal | ............... C23C 16/32 |
| | | | | 423/439 |
| 5,658,834 A | * | 8/1997 | Dowben | ................. H01L 29/24 |
| | | | | 117/103 |

(Continued)

OTHER PUBLICATIONS

Nordell, Bradley et al, Leakage current mechanisms in PECVD grown amorphous hydrogenated boron carbide thin films, APS Mar. Meeting 2014, Mar. 2014. (Year: 2014).*

(Continued)

*Primary Examiner* — David P Turocy
(74) *Attorney, Agent, or Firm* — Suiter Swantz pc llo

(57) ABSTRACT

A method of forming a low-dielectric-constant amorphous hydrogenated boron carbide film on a substrate includes positioning the substrate within a plasma enhanced chemical vapor deposition (PECVD) chamber, providing a boron carbide precursor and introducing the boron carbide precursor into a carrier gas to form a carrier gas-precursor mixture. The method also includes introducing the carrier gas-precursor mixture into the PECVD chamber. The method also includes applying radio frequency power within the PECVD chamber to the carrier gas-precursor mixture to form one or more plasmas containing one or more species containing at least one of boron, carbon or hydrogen. The method also includes forming the low-dielectric-constant amorphous hydrogenated boron carbide film on the substrate within the PECVD chamber.

14 Claims, 20 Drawing Sheets

(51) Int. Cl.
    *C23C 16/455*     (2006.01)
    *H01L 21/02*     (2006.01)

(56) References Cited

U.S. PATENT DOCUMENTS

| | | | | |
|---|---|---|---|---|
| 6,352,921 | B1* | 3/2002 | Han | H01L 21/76807 257/E21.579 |
| 2004/0084690 | A1* | 5/2004 | Dowben | G01T 1/2985 257/183 |
| 2010/0255198 | A1* | 10/2010 | Cleary | C23C 16/4402 427/255.39 |
| 2011/0169554 | A1* | 7/2011 | Keysar | H01L 25/167 327/530 |
| 2012/0037904 | A1* | 2/2012 | Caruso | H01L 21/0237 257/53 |

OTHER PUBLICATIONS

A.O. Sezer and J. I. Brand, "Chemical vapor deposition of boron carbide," Mater. Sci. Eng. B, vol. 79, No. 3, pp. 191-202, Feb. 2001.

S. W. King, "Dielectric Barrier, Etch Stop, and Metal Capping 22 Materials for State of the Art and beyond Metal Interconnects", ECS J. Solid State Sci. Technol. 4, N3029-N3047 (2015).

Paquette, M. M. et al. "The local physical structure of amorphous hydrogenated boron carbide: insights from magic angle spinning solid-state NMR spectroscopy", J. Phys. Condens. Matter 23, 435002 (2011), 1-12.

B. J. Nordell et al., "The Influence of Hydrogen on the Chemical, Mechanical, Optical/Electronic, and Electrical Transport Properties of Amorphous Hydrogenated Boron Carbide", J. Appl. Phys. 118, 035703-035703-16 (2015).

B. J. Nordell, C. L. Keck, T. D. Nguyen, A. N. Caruso, S. S. Purohit, W. A. Lanford, D. Dutta, D. Gidley, P. Henry, S. W. King, M. M. Paquette, Tuning the properties of a complex disordered material: Full factorial investigation of PECVD-grown amorphous hydrogenated boron carbide, Mater. Chem. Phys. 2016, 173, 268-284.

A. Grill, S. M. Gates, T. E. Ryan, S. V. Nguyen, D. Priyadarshini, "Progress in the development and understanding of advanced low k and ultralow k dielectrics for very large-scale integrated interconnects—State of the art", Appl. Phys. Rev. 2014, 1, 011306-011306-17.

W. Zhou, S. Bailey, R. Sooryakumar, S. King, G. Xu, E. Mays, C. Ege, J. Bielefeld, "Elastic Properties of Porous Low-k Dielectric Nano-Films", J. Appl. Phys. 2011, 110, 043520-043520-8.

M. T. Alam, R. A. Pulavarthy, J. Bielefeld, S. W. King, M. A. Hague, "Thermal Conductivity Measurement of Low-k Dielectric Films: Effect of Porosity and Density", J. Electron. Mater. 2013, 43, 746-754.

T. A. Pomorski, B. C. Bittel, P. M. Lenahan, E. Mays, C. Ege, J. Bielefeld, D. Michalak, S. W. King, "Defect Structure and Electronic Properties of SiOC:H Films Used for Back End of the Line Dielectrics", J. Appl. Phys. 2014, 115, 234508-234508-20.

K. Vanstreels, C. Wu, M. R. Baklanov, "Mechanical Stability of Porous Low-k Dielectrics", ECS J. Solid State Sci. Technol. 2014, 4, N3058-N3064.

S. W. King, D. Jacob, D. Vanleuven, B. Colvin, J. Kelly, M. French, J. Bielefeld, D. Dutta, M. Liu, D. Gidley, "Film Property Requirements for Hermetic Low-k a-SiOxCyNz:H Dielectric Barriers", ECS J. Solid State Sci. Technol. 2012, 1, N115, 011306-011306-17.

Y.L. Cheng, J. Wu, T.-J. Chiu, S.-A. Chen, Y.-L. Wang, "Comprehensive comparison of electrical and reliability characteristics of various copper barrier films", J. Vac. Sci. Technol. B Microelectron. Nanom. Struct. 2011, 29, 031207-031207-7.

C. Casiraghi, A.C. Ferrari and J. Robertson, "Raman spectroscopy of hydrogenated amorphous carbons", Physical Review, B 72, 085401-1-085401-14 (2005).

Shailesh Dhungana, Bradley J. Nordell, Anthony N. Caruso and Michelle M. Paquette, "Combinatorial survey of fluorinated plasma etching in the silicon-oxygen-carbon-nitrogen-hydrogen system", J. Vac Sci. Technol. A 34(6), Nov./Dec. 2016, 061302-1-061302-18.

Ruqiang Bao and Douglas B. Chrisey, "Thin Solid Films", Elsevier, 519 (2010), 164-168.

A.K. Bandyopadhyay, F. Beuneu and L. Zuppiroli, "The Role of Free Carbon in the Transport and Magnetic Properties of Boron Carbide", Journal of Physics and Chemistry of Solids, vol. 45, No. 2, pp. 207-214, 1984.

* cited by examiner

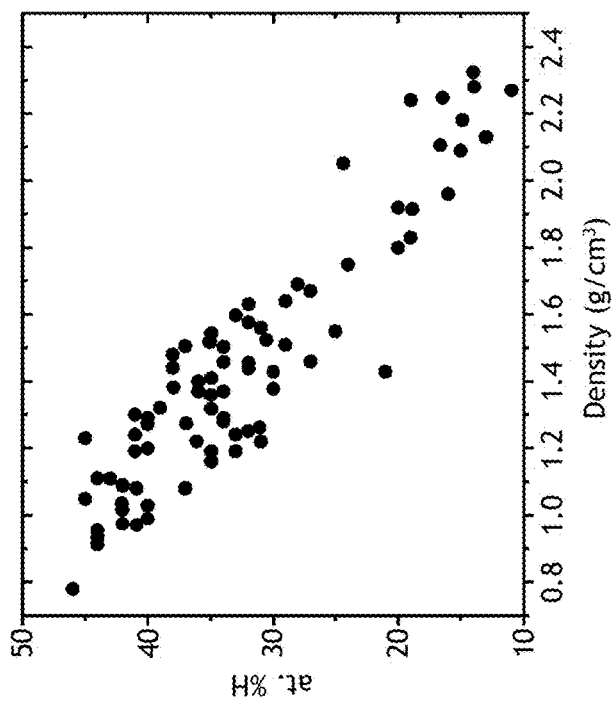
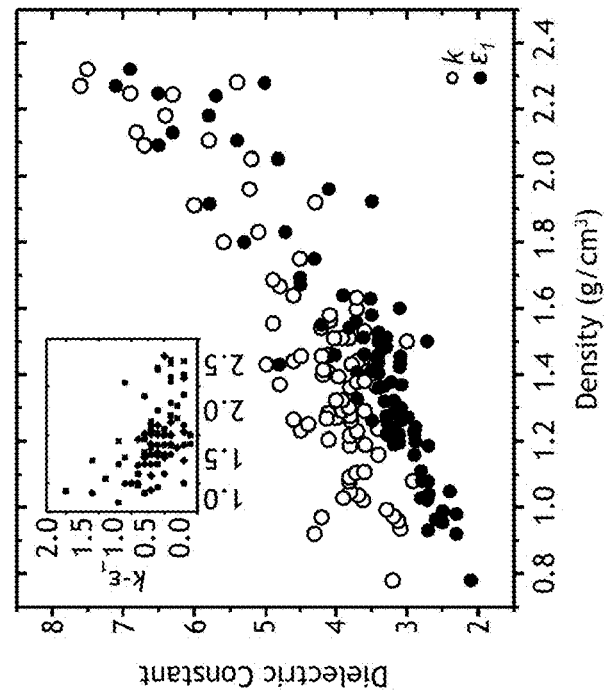
FIG. 5B
FIG. 5A

AMORPHOUS HYDROGENATED BORON CARBIDE LOW-K DIELECTRIC AND METHOD OF MAKING THE SAME

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC § 119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled AMORPHOUS HYDROGENATED BORON CARBIDE FILMS AND FABRICATION METHOD THEREOF, naming Anthony Caruso, Michelle Paquette and Bradley Nordell as inventors, filed Apr. 6, 2015, Application Ser. No. 62/178,320, which is incorporated herein by reference in the entirety.

For purposes of the USPTO extra-statutory requirements, the present application constitutes a regular (non-provisional) patent application of United States Provisional Patent Application entitled AMORPHOUS HYDROGENATED BORON CARBIDE FROM CARBORANE AND METHANE FOR LOW DIELECTRIC CONSTANT INTERLAYER DIELECTRICS, naming Michelle Paquette, Bradley Nordell and Anthony Caruso as inventors, filed Oct. 21, 2015, Application Ser. No. 62/244,538, which is incorporated herein by reference in the entirety.

This invention was made with government support under Grant No. HDTRA-10-1-0092 awarded by the DEFENSE THREAT REDUCTION AGENCY. The government has certain rights in this invention.

TECHNICAL FIELD

The present invention generally relates to a low-dielectric-constant material for use in interconnect structures within integrated circuits and a method of forming the same and, more particularly, to a low-dielectric-constant amorphous hydrogenated boron carbide and a method of forming the same.

BACKGROUND

As the demand for integrated circuits having ever-smaller device features continues to increase, challenges to meet this demand must be met. As device features continue to decrease in size, resistance-capacitance (RC) delay in metal interconnects of devices remains an obstacle to improving computing performance. To support further increases in transistor density, either conductor resistance or dielectric capacitance must decrease. Whereas copper has been the conductor material of choice for interconnects since the introduction of the dual damascene process in the late 1990's, the pursuit of new low-dielectric-constant ('low-k') materials to replace traditional $SiO_2$ (k≈4) has remained a priority in the semiconductor industry for decades.

Several types of low-k dielectrics exist. Types of low-k dielectrics include the bulk inter/intra-layer dielectric (ILD), which has the most stringent requirements on k, as well as dielectric diffusion barriers, etch stop layers, hard masks, and spacer layers, which have more modest k requirements but additional performance metrics that must be met.

Low-k materials have steadily improved, with the most recent introduction of porous SiOC:H variants (k=2.4-2.7) for ILDs and SiC:H (k=4.0-7.0) and SiCN:H (k=4.5-5.8) as diffusion barrier materials. An additional challenge, however, includes the difficulty in simultaneously maintaining chemical, thermal, electrical, and mechanical reliability. As a result, as dielectric needs are met through the engineering of a given dielectric material, the chemical, thermal and/or mechanical characteristics of that dielectric material in many cases suffer. For example, the falloff in mechanical properties with decreasing k, dubbed the 'low-k death curve,' is one of the key obstacles to further improvements in ultra-low-k ILD materials. Therefore, it would be desirable to provide a method of forming an improved dielectric material, which serves as an alternative to silicon-based materials for interconnect dielectric applications.

BRIEF DESCRIPTION OF THE DRAWINGS

The numerous advantages of the disclosure may be better understood by those skilled in the art by reference to the accompanying figures in which:

FIGS. 5A-5D illustrate mechanical and dielectric properties of multiple hydrogenated boron carbide films formed across a number of the various parameter regimes, in accordance with one or more embodiments of the present disclosure.

DETAILED DESCRIPTION OF THE INVENTION

Reference will now be made in detail to the subject matter disclosed, which is illustrated in the accompanying drawings.

Referring generally to FIGS. 1A through 4B, amorphous hydrogenated boron carbide films and carbon-enriched amorphous hydrogenated boron carbide films and a system and method for forming the same are described in accordance with the present disclosure.

It is noted that the achievement of a low dielectric constant alone is not sufficient for modern interconnect dielectric applications, and must be accompanied by adequate chemical, electrical, and mechanical stability for a low-k material to be considered for integration in modern interconnect dielectric applications.

Applicants have developed the films/materials of the present disclosure to achieve the lowest possible k value, while simultaneously optimizing, or at least improving, complementary performance metrics. Applicants have formed amorphous hydrogenated boron carbide materials/films that display moderate k values (3-4), which can be deposited with good electrical, chemical and mechanical properties suitable for applications having stringent performance requirements. In addition, Applicants have formed carbon-enriched amorphous hydrogenated boron carbide materials/films that also display moderate k values (2.5-3.0), which also possess good electrical, chemical and mechanical properties suitable for applications having stringent performance requirements. Such applications include, but are not limited to, a metal capping layer, a dielectric diffusion barrier (DBB), an etch stop layer (ESL), a dielectric capping layer, a hard mask (e.g., nonsacrificial hard mask), or a space layer. Applicants also note that various films of the present disclosure are suitable for use as an interlayer and/or intralayer low-k dielectric (ILD) materials.

Embodiments of the present disclosure are directed to the formation of boron carbide dielectric materials and films that achieve electrical, chemical, mechanical properties suitable for use in interconnect dielectric applications. Some embodiments of the present disclosure are directed to a system and method for forming films of amorphous hydrogenated boron carbide films via plasma enhanced chemical vapor deposition (PECVD) utilizing a single-molecule precursor, such as, but not limited to, ortho-carborane (o-$C_2B_{10}H_{12}$). Additional embodiments of the present disclosure are directed to a PECVD system and method for forming films of amorphous hydrogenated boron carbide films and/or carbon-enriched amorphous hydrogenated boron carbide films utilizing ortho-carborane and an additional carbon source, such as, but not limited to, methane ($CH_4$) gas. Applicants have shown that films formed utilizing the above approaches may be tuned to achieve a number of desired specifications tailored to the targeted application.

Figure 1A:
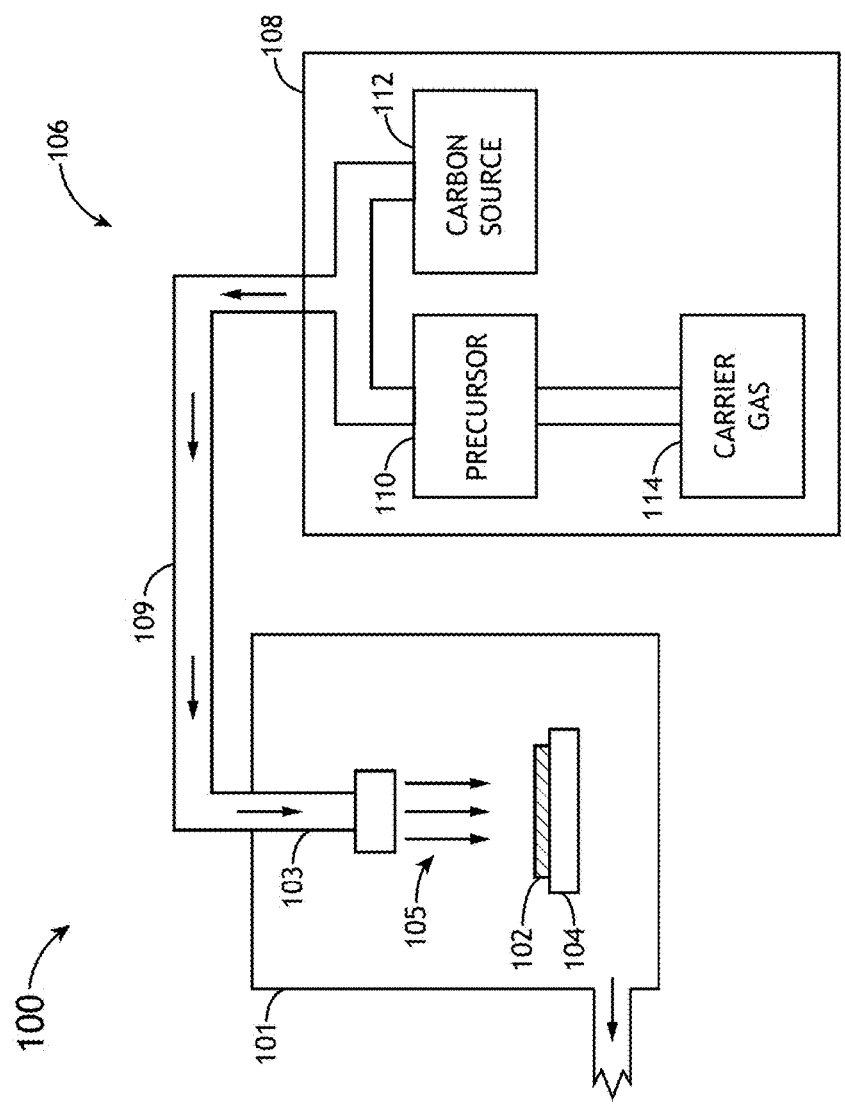
FIG. 1A is a conceptual view of a deposition system, in accordance with one embodiment of the present disclosure.

FIG. 1A illustrates a conceptual view of a deposition system 100 suitable for depositing amorphous hydrogenated boron carbide and/or carbon enriched amorphous hydrogenated boron carbide films on a selected substrate 102, in accordance with an embodiment of the present disclosure. The system 100 may be configured to carry out any type of plasma enhanced chemical vapor deposition (PECVD) process of chemical vapor deposition (CVD) process known in the art of thin film fabrication. In one embodiment, the system 100 includes a deposition chamber 101 (e.g., PECVD chamber). In another embodiment, the deposition chamber includes a precursor delivery unit 103 (e.g., showerhead) for supplying precursor material 105/plasma to substrate 102 disposed on a substrate holder 104.

In another embodiment, the deposition system 100 includes a material management system 106. The material management system 106 may include a set of material sources 108 and a manifold system 109 for transferring material from the material sources 108 to the precursor delivery unit 103. The material management system 106 may include any number and type of material sources (e.g., carrier gas sources, precursor sources or carbon sources), gas lines, valves and the like necessary to introduce the one or more selected precursor materials into the deposition chamber 101.

Figure 1B:
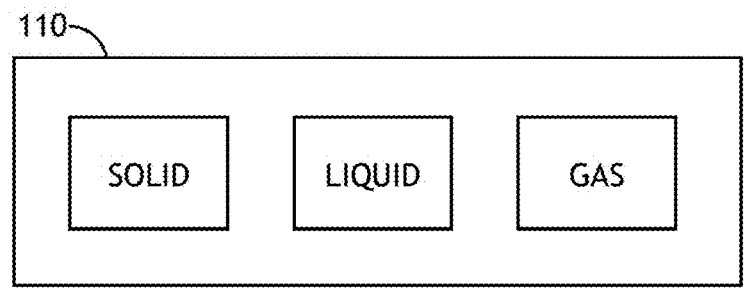
FIG. 1B is a conceptual view of the forms of the boron carbide precursor, in accordance with one or more embodiments of the present disclosure.

In one embodiment, the set of material sources 108 include a precursor source 110. The precursor source 110 may include any boron carbide precursor. For example, the precursor source 110 may include, but is not limited to, a source of carborane. For instance, the precursor source 110 may include, but is not limited to, an ortho-carborane source. It is noted herein that the system 100 of FIG. 1A is not limited to an ortho-carborane source and any boron carbide source known in the art or described in the present disclosure may serve as the boron carbide precursor source 110. As shown in FIG. 1B, the precursor source 110 may be provided in solid, liquid, or gas form or any combination of a solid, liquid and gas.

In another embodiment, the set of material sources 108 includes a carrier gas source 114. The carrier gas source 114 may include any carrier gas source known in the art. For example, the carrier gas source 114 may include an inert gas source, such as, but not limited to, argon (Ar) or molecular nitrogen ($N_2$).

The carrier gas from the carrier gas source 114 may uptake a portion of the precursor material and transport it to the chamber 101 via the manifold 109. For example, the carrier gas may uptake the precursor material via sublimation of the precursor material in the case of a solid precursor material. By way of another example, the carrier gas may uptake the precursor material via evaporation of the precursor material in the case of a liquid precursor material. By way of another example, the carrier gas may uptake the precursor material via gas mixing of the precursor material in the case of a gaseous precursor material. In the case of a gaseous precursor material the gaseous precursor may be directly introduced into the process gas of the system 100. In this case, the carrier gas and carrier gas source 114 are not necessary.

Figure 1C:
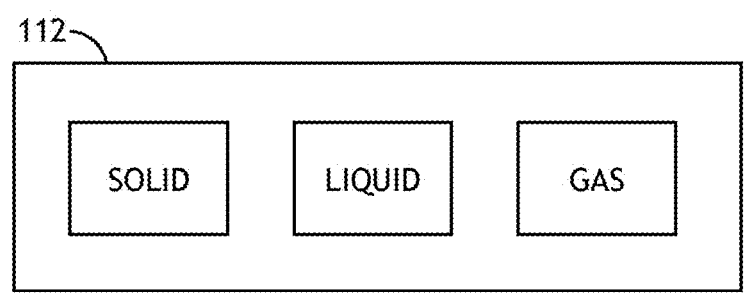
FIG. 1C is a conceptual view of the forms of the carbon source, in accordance with one or more embodiments of the present disclosure.

In another embodiment, the set of material sources 108 includes a carbon source 112. The carbon source 112 is used to enrich films formed via the deposition process with carbon. For example, the supply of additional carbon during a PECVD process may result in additional CH3 for network termination in the resulting material and/or additional CH2 for network bridging in the resulting material. The carbon source 112 may include any carbon source known in the art. For example, the carbon source 112 may include one or more hydrocarbons, such as, but not limited to, methane, ethylene, acetylene or ethane. Further, in the case of gaseous hydrocarbons, the carbon source 112 need not be coupled directly to the carrier gas source. For instance, as shown in FIG. 1A, a hydrocarbon source may be introduced directly into the precursor-carrier gas mixture. In addition, although not shown, the hydrocarbon source may be introduced directly into chamber 101 via a dedicated delivery line, whereby mixing of the precursor-carrier gas mixture and the hydrocarbon source occurs within the chamber 101. As shown in FIG. 1C, the carbon source 112 may be provided in solid, liquid, or gas form or any combination of a solid, liquid and gas.

Figure 1D:
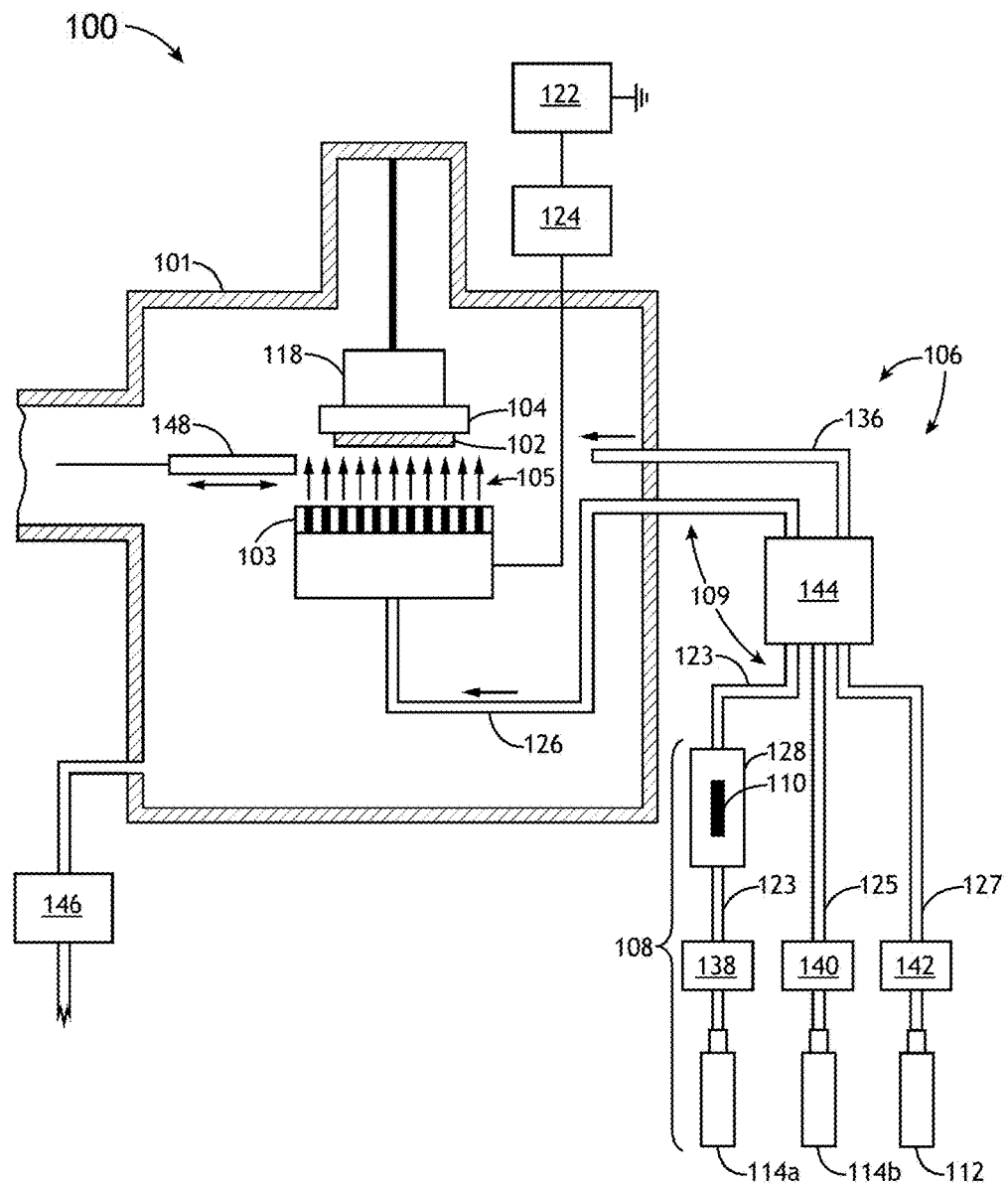
FIG. 1D is a simplified schematic view of a plasma enhanced chemical vapor deposition (PECVD) system, in accordance with one embodiment of the present disclosure.

FIG. 1D illustrates a simplified schematic view of system 100 configured for depositing amorphous hydrogenated boron carbide on a substrate via plasma enhanced chemical vapor deposition (PECVD), in accordance with one or more embodiments of the present disclosure.

It is noted that the embodiment depicted in FIG. 1D is configured for carrying out parallel-plate capacitively coupled plasma enhanced chemical vapor deposition on a selected substrate 102. While much of the disclosure focuses on capacitively coupled PECVD, it is noted that this configuration is not a limitation on the scope of the present disclosure. As noted previously herein, the system 100 may extend to any type of PECVD system or CVD system known in the art of thin film fabrication. For example, the deposition system 100 may include any PECVD configuration known in the art of plasma enhanced chemical vapor deposition. For example, in addition to capacitively coupled PECVD, system 100 may include, but is not limited to, an inductively coupled PECVD system. By way of another example, the system 100 may include, but is not limited to, electron cyclotron resonance PECVD system. Further, system 100 may include a chemical vapor deposition (CVD) system. For example, the system 100 may be configured as a thermal CVD system, hot filament CVD system, an initiated CVD system and the like. CVD deposition of boron carbide is described general in A. O. Sezer and J. I. Brand, "Chemical vapor deposition of boron carbide," *Mater. Sci. Eng.* B, vol. 79, no. 3, pp. 191-202, February 2001, which is incorporated by reference in the entirety.

Referring again to FIG. 1D, the substrate 102 may include any substrate known in the art. In one embodiment, the substrate 102 includes a semiconductor wafer. For example, the substrate 102 may include, but is not limited to, a silicon wafer. In another embodiment, the substrate 102 includes a conductive material. For example, the substrate 102 may include, but is not limited to, a metal. In another embodiment, the substrate 102 includes an insulating material. For example, the substrate 102 may include, but is not limited to, a ceramic, glass or any insulating material known in the art.

In one embodiment, the system 100 includes a PECVD deposition chamber 101 equipped with a substrate holder 104. In another embodiment, the substrate holder 104 is equipped with a substrate heating element 118. The substrate heating element 118 may include any substrate heating element or heater known in the art of vacuum technology. For example, the substrate heating element 118 may include, but is not limited to, a light source. For instance, the substrate heating element 118 may include, but is not limited to, one or more halogen lamps.

In another embodiment, the precursor delivery unit 103 of system 100 includes a showerhead. The precursor delivery unit 103 is configured to deliver precursor material (e.g., o-$C_2B_{10}H_{12}$) into the internal volume of the PECVD chamber 101 for plasma production. In one embodiment, the precursor delivery unit 103 is located below the substrate 102, whereby the generated plasma 105 travels upward to the substrate 102 for deposition. In this sense, the PECVD chamber 101, as depicted in FIG. 1D, is referred to herein as "an inverted PECVD chamber." In another embodiment, as shown in FIG. 1A, the PECVD system 101 may be configured in a standard configuration, whereby the precursor delivery unit 103 is positioned above the substrate 102. It is noted that the particular arrangement of the precursor delivery unit 103 and the substrate 102 is not a limitation of the scope of the present disclosure as the particular configurations are provided merely for illustrative purposes.

In another embodiment, the system 100 includes an anode and cathode for delivering radio frequency (RF) power to the precursor material so as to produce plasma 105. The plasma 105 is formed from the precursor material and/or other gas constituents introduced into the PECVD chamber 101 and contains one or more free radicals and/or ions containing boron, carbon and/or hydrogen. In one embodiment, the substrate holder 104 forms the anode of the system 100, while the precursor delivery unit 103 forms the cathode of the system 100. In one embodiment, RF power is delivered to the plasma 105 using RF generator 122. In this regard, the RF generator 122 supplies high frequency (HF) RF power, which is radiated through the precursor delivery unit 103 so as to provide power to the plasma 105. For example, the RF power may be supplied at a frequency of 13.56 MHz via the RF generator 122 and a matching network 124. It is noted that the RF delivery of the present disclosure is not limited to a frequency of 13.56 MHz. Rather, it is noted that the RF generator 122 may deliver RF power through the precursor delivery unit 103 at any suitable frequency or frequency regime known in the art of plasma enhanced chemical vapor deposition. For example, RF power may be delivered in DC mode. By way of another example, RF power may be delivered between 200-400 kHz. By way of another example, RF power may be delivered at a frequency of 27.2 MHz.

As discussed previously herein, the set of material sources 108 of the material management system 106 may include a precursor source 110. In one embodiment, the precursor source 110 may include a solid precursor source. In one embodiment, the precursor source 110 includes a boron carbide precursor including one or more single-molecule boron and/or carbon sources. In one embodiment, the one or more single-molecule boron carbide precursors may include one or more carborane sources. For example, in the case of a solid precursor material, a carborane-based precursor source may include, but is not limited to, ortho-carborane (1,2-$C_2B_{10}H_{12}$), meta-carborane (1,7-$C_2B_{10}H_{12}$) and/or para-carborane (1,12-$C_2B_{10}H_{12}$). It is noted herein that each of these carboranes is an isometric icosahedral closo-carborane, with the variation being the positioning of carbon atoms. In another embodiment, the one or more single-molecule boron carbide precursors may include one or more carborane derivative sources. For example, a carborane-derivative-based precursor source may include, but is not limited to, alkyl-carborane, thiol-carborane and/or hydroxyl-carborane.

While much of the focus of the present disclosure is on single-molecule boron carbide precursor materials, this is not a limitation on the scope of the present disclosure. For example, the precursor material may include a first precursor material and a second precursor material. In one embodiment, the first precursor material is a boron source, while the second precursor material is a carbon source. For example, the boron source may include a borane, such as but not limited to, pentaborane ($B_5H_9$) or decaborane ($B_{10}H_{14}$). By way of another example, the carbon source may include a hydrocarbon, such as, but not limited to, methane, ethylene, acetylene or ethane. In this regard, the first precursor and the second precursor may both be introduced into a carrier gas (e.g., via sublimation as described herein), whereby the carrier gas flows associated with the first precursor and the second precursor are then mixed (e.g., mixed in mixing chamber).

In another embodiment, the precursor source 110 may include a liquid precursor source. In one embodiment, liquid precursor suitable for use as a boron carbide precursor may include, but is not limited to, acyl chloride carborane.

In another embodiment, the precursor source 110 may include one or more gaseous precursor sources. In one embodiment, the one or more gaseous precursor sources include a first precursor and a second precursor. In one embodiment, the first precursor is a boron source and the second precursor is a carbon source, whereby both the first and second precursors may be introduced into the chamber 101 for plasma generation. For example, the first precursor may include a boron source, such as, but not limited to, boron trichloride ($BCl_3$), or diborane ($B_2H_6$). By way of another example, the second precursor may include a carbon source, such as, but not limited to a hydrocarbon (e.g., methane, ethylene, acetylene or ethane). It is noted that in the case of a gaseous precursor a carrier gas is not required to uptake and transport the precursor to chamber 101. For example, the one or more gaseous precursors may be directly transported to the precursor delivery unit 103 from the gaseous precursor source (e.g., gas tank).

In one embodiment, the set of material sources 108 of the material management system 106 includes one or more carrier gas sources 114a, 114b. For example, the one or more carrier gas sources 114a, 114b may include, but are not limited to, one or more carrier gas tanks. The carrier gas may include any carrier gas known in the art of plasma enhanced chemical vapor deposition. For example, the carrier gas may include one or more inert gases, such as, but not limited to, argon (Ar), molecular nitrogen ($N_2$) and the like.

In another embodiment, the set of material sources 108 includes a carbon source 112. The carbon source 112 may be used to form carbon-enriched films via the PECVD deposition process. For example, the supply of additional carbon during the PECVD process may result in the supply of additional carbon-containing free radicals and/or ions in the plasma 105.

For example, in the case of a hydrocarbon-based carbon source, the additional carbon-containing free radicals may include methyl ($CH_3$) radicals. The addition of $CH_3$ may provide for increased network termination in the resulting material. By way of another example, the additional carbon-containing free radicals may include carbene ($CH_2$) radicals. The additional of $CH_2$ may provide form increased bridging between chemical groups within the resulting material for network bridging in the resulting material. In this regard, the carbon source or sources may be supplied so as to tune the amount of networking or bridging in the resulting boron carbide film, which, in turn, provides for the control of various film properties. It is noted herein that the above-listed radicals are provided merely for illustration and are not intended to be a limitation on the scope of the present disclosure.

The carbon source 112 may include any carbon source known in the art. For example, the carbon source 112 may include one or more hydrocarbons, such as, but not limited to, methane, ethylene, acetylene or ethane. Further, in the case of gaseous hydrocarbons, the carbon source 112 need not be coupled directly to a carrier gas source (such as 114a, 114b). For instance, as shown in FIG. 1D, a carbon source 112 may be coupled to the mixing chamber 144. In this regard, carbon-containing gas may be transported to the mixing chamber 144 where it is then mixed with the precursor-carrier gas mixture from delivery line 138. In another embodiment, the carbon-containing compound may be introduced directly into chamber 101 via a dedicated delivery line, whereby mixing of the precursor-carrier gas mixture and the carbon-containing compound occurs within the chamber 101.

The carbon source may be mixed with the precursor-carrier gas mixture in any suitable proportion. For example, in the case of methane, applicants have shown that providing a partial flow of methane between 1 and 50%, such as between 2.5 and 10%, of the total flow rate of the carrier gas flow provides high quality carbon-enriched amorphous hydrogenated boron carbide films, as discussed further herein.

In another embodiment, the set of material sources 108 includes a process gas source (not shown). The process gas source may provide process gas to the PECVD chamber 101. In some embodiments, the precursor material 110 may be sublimed, evaporate or mixed into the process gas directly without the need of a carrier gas. The process gas may include any process gas known in the art, such as, but not limited to, an inert gas (e.g., Ar).

In another embodiment, the manifold 109 of the material management system 106 includes a precursor delivery line 126. The precursor delivery line 126 may deliver precursor material, such as precursor material 110 (shown in FIG. 1E), to the precursor delivery unit 103. For instance, the precursor delivery line 126 may transport carrier gas carrying precursor material 110 to the precursor delivery unit 103 and into the PECVD chamber 101.

Figure 1E:
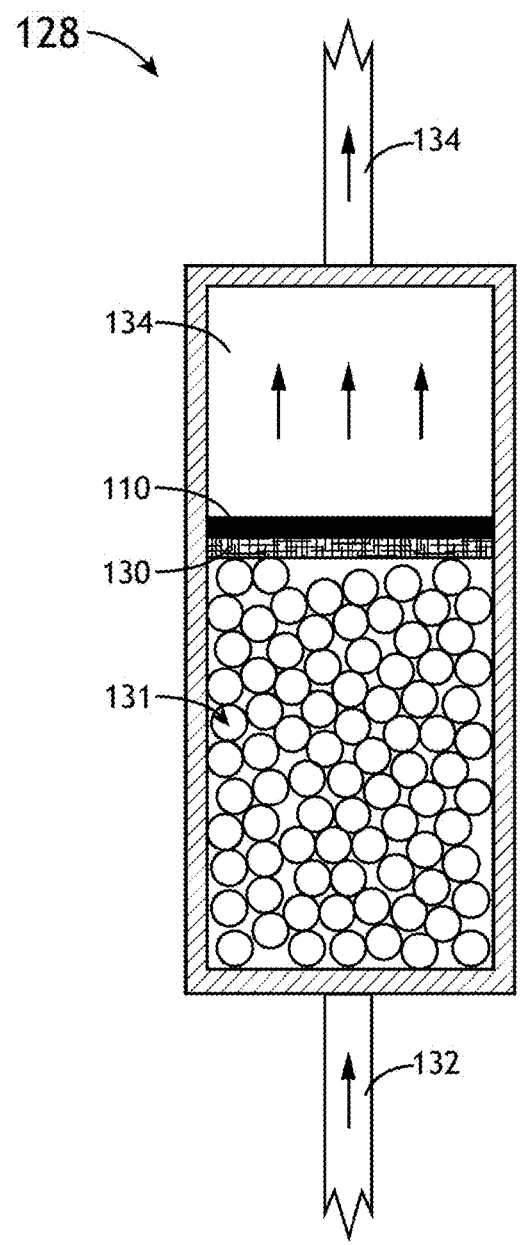
FIG. 1E is a simplified schematic view of a bubbler unit of the PECVD system for subliming a solid precursor material into a carrier gas, in accordance with one embodiment of the present disclosure.

In one embodiment, as shown in FIG. 1E, the material management system 106 includes a bubbler unit 128. The bubbler unit 128 may include a plurality of spheres 131 (e.g., glass spheres). In another embodiment, in the case of a solid precursor, the bubbler unit 128 includes one or more mesh elements 130 (e.g., wire mesh screen) positioned above the spheres 131 for holding the precursor material 110. The carrier gas 132 from carrier gas source 110 is then flowed through the bubbler unit 128 so that a portion of the precursor material 110 is sublimed into the carrier gas. In this regard, the carrier gas 134 exiting the bubbler unit 128 constitutes a mixture of the initial carrier gas 132 and the precursor material 110. In the case of a solid precursor the term "bubbler unit" may be used interchangeably with the term "sublimer."

In another embodiment, the carrier gas 132 is heated to a selected temperature prior to the carrier gas being flowed through the bubbler unit 128. For example, the carrier gas 132 may be heated to a temperature between 25 and 300° C., such as, but not limited to, approximately 75° C. The carrier gas may be heated in any manner known in the art. For instance, the carrier gas may be heated by heating the delivery line 123 positioned upstream from the bubbler unit 128. Further, the carrier gas (after uptaking the precursor material 110) may be maintained at an elevated temperature through the heating of the delivery line 126 positioned downstream from the bubbler unit 128 and/or the precursor delivery unit 103.

By way of example, in the case of an ortho-carborane precursor and an Ar carrier gas, a volume of ortho-carborane powder may be disposed on the one or more mesh elements 130 at a position above spheres 131. Then, heated argon gas is transported through the bubbler unit 128 so a portion of the ortho-carborane sublimes into the heated argon gas. Following uptake of the ortho-carborane by the heated argon gas, the mixture of argon and ortho-carborane is transported to the precursor delivery unit 103 via delivery line 126 for PECVD deposition.

It is noted that while FIG. 1A depicts a single carrier gas/bubbler unit line, this is not a limitation on the present disclosure. It is noted that system 100 may include multiple bubbler units 128, each containing the ortho-carborane precursor (or different precursor materials).

In another embodiment, additional gas source 114b delivers carrier and/or process gas via delivery line 125 (or via a direct line) to the PECVD chamber 101. In one embodiment, the delivery line 125 provides carrier gas (e.g., argon) without passing it through bubbler unit 128. In another embodiment, the material management system 106 includes a mixing chamber 144. In this regard, the precursor/carrier gas mixture of delivery line 123 may be mixed with the carrier gas from delivery line 125 prior to the gas being delivered to the precursor delivery unit 103 via line 126 or the PECVD chamber via purge line 136.

In another embodiment, as noted previously herein, the additional gas source 114b may supply process gas directly to the PECVD chamber (not shown). In this regard, the precursor/carrier gas mixture of delivery line 123 may be mixed with the process gas from source 114b. In this regard, the additional carrier/process gas from source 114b may be mixed with the carrier gas-precursor mixture of line 123 in a selected proportion. In this regard, the partial flow rate along line 123 (i.e., carrying carrier gas-precursor mixture) may be controlled relative to the total flow rate going into the PECVD chamber 101. It is noted that in this embodiment the carrier gas and process gas may be, but are not required to be, the same type of gas (e.g., argon) and may be supplied from the same source or different sources.

In another embodiment, the system material management system 106 includes one or more mass flow controllers 138, 140, 142. For example, a first mass flow controller 138 may be programmed to control the flow of carrier gas from the first gas source 114a along delivery line 123. By way of another example, a second mass flow controller 140 may be programmed to control the flow of carrier gas from the second gas source 114b along delivery line 125. By way of another example, a third mass flow controller 142 may be programmed to control the flow of carbon-containing gas from the carbon gas source 112 along delivery line 127. Further, each of the flow controllers 138, 140, 142 may be controlled via a control box (not shown) communicatively coupled to the flow controllers 138, 140, 142. The mass flow controllers 138, 140, 142 may be programmed to provide mass flow rates in the delivery line 123, delivery line 125 and/or delivery line 127 suitable for PECVD deposition. For example, one or more of the mass controllers may provide a total mass flow rate of the carrier gas of between 5 and 500 sccm (e.g., 200 sccm). Further, the one or more of the mass controllers may provide a partial mass flow rate of the carrier gas passing through the precursor material (along line 123) of 0.1 to 1 sccm (e.g., 1 sccm). Here, a partial flow rate of carrier gas through the precursor of 1 represents the case where 100% of the carrier gas flow is through the precursor, where a partial flow rate of 0.1 represents the case where 10% of the carrier gas flow is through the precursor. Further, the one or more of the mass controllers may provide a partial mass flow rate of the carbon source of 1-50% (e.g., 2.5-10%) of the total mass flow rate of the carrier gas.

In another embodiment, the system 100 includes multiple valves (not shown). The valves may be controlled so as to control the various flows into and out of the PECVD chamber 101 as well the relative amount of precursor 110 and/or carbon source 112 delivered to the delivery line 126.

In another embodiment, although not shown, the system 100 may include one or more $O_2$ and/or $H_2O$ filters. For example, $O_2$ and/or $H_2O$ filters may be placed in-line with the carrier/process gas sources 114a, 114b and/or carbon source 112 so as to remove $O_2$ and/or $H_2O$ from the respective gases.

In one embodiment, the system 100 includes one or more pumps 146 for evacuating the PECVD chamber 101 to a selected pressure. As discussed further herein, the PECVD chamber 101 is suitable for establishing a base pressure of between $5 \times 10^{-8}$ to $5 \times 10^{-8}$ Torr. The one or more pumps 146 of system 100 may include any pump or pumps suitable for establishing a base pressure between $5 \times 10^{-8}$ to $5 \times 10^{-8}$ Torr. For example, the one or more pumps 146 may include, but are not limited to, a turbo pump. In addition, one or more additional pumps (not shown) may be used throughout the system 100 to augment the pumping abilities of pump 146. For example, the one or more additional pumps, although not shown, may include, but are not limited to, a roughing pump (e.g., mechanical pump).

In another embodiment, the PECVD chamber 101 includes a substrate handler 148. The substrate handler 148 may be used to move one or more substrates 102 into and out of the PECVD chamber 101 as well as position the one or more substrates 102 onto and off of the substrate holder 104.

While much of the present disclosure has focused on system 100 in the context of a solid precursor dispersed into a carrier gas, this is not a limitation on the present disclosure. For example, the various system and method embodiments may be extend to a direct introduction configuration, whereby precursor material is introduced directly into the chamber 101. For instance, in the case of a solid precursor, the solid precursor may be placed within the chamber 101, whereby the solid precursor undergoes sublimation. A liquid precursor material may be introduced into the PECVD chamber 101 directly, whereby the liquid precursor evaporates directly into the process gas (e.g., Ar) of the system 100, either within the chamber 101 or in a dedicated boiling unit. In the case of gaseous precursor material or materials, the gaseous material may be introduced into the PECVD chamber 101 directly, whereby the gaseous precursor or precursors are mixed with the process gas of the PECVD system 100. It is further noted that the carbon source 112 discussed herein may also be introduced into the chamber 101 along similar modes.

FIGS. 2A-2D illustrate simplified cross-sectional views of features in an interconnect device requiring tailor dielectric and/or mechanical, chemical and electrical properties, in accordance with one or more embodiments of the present disclosure.

Figure 2A:
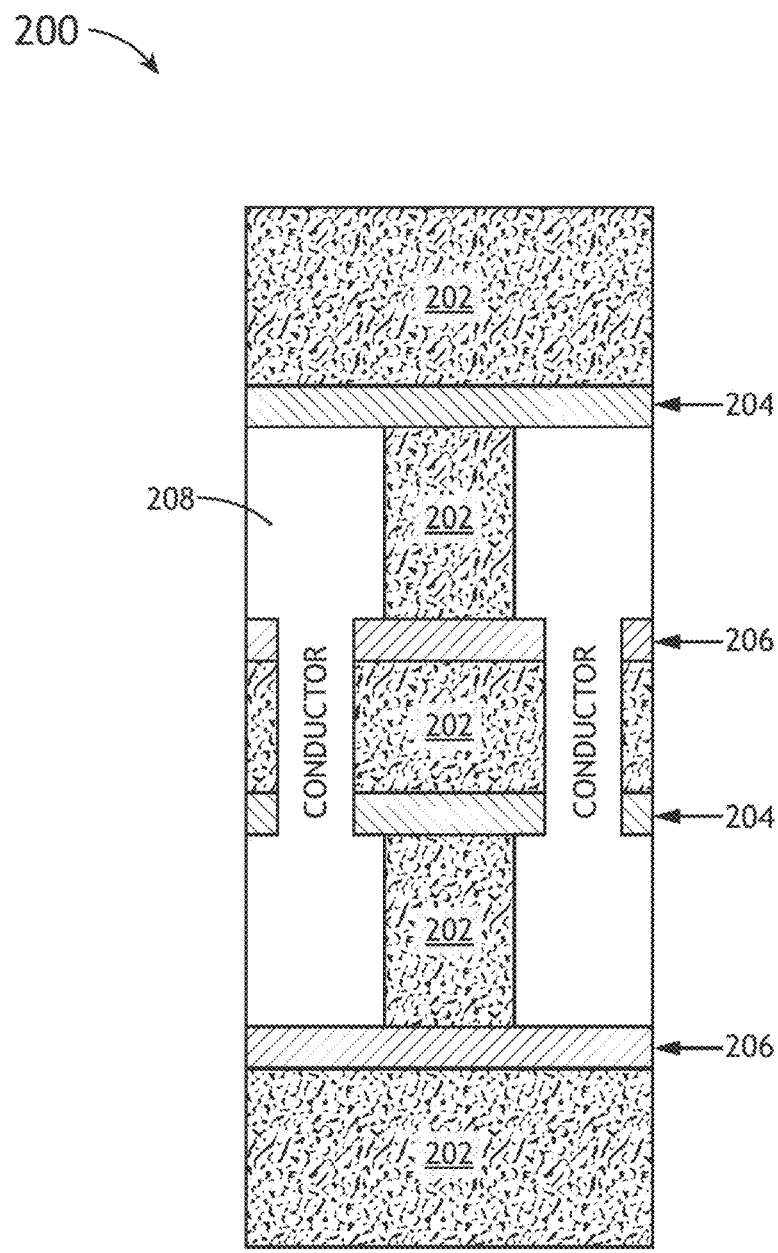
FIG. 2A is a simplified schematic view of a metal interconnect device, in accordance with one embodiment of the present disclosure.

FIG. 2A depicts a conceptual cross-sectional view of an interconnect device 200 suitable for use in one or more electronic devices, in accordance with one or more embodiments of the present disclosure. In one embodiment, the interconnect device 200 includes an interlayer dielectric 202. It is noted that the interlayer dielectric 202 may be formed with any suitable layer described in the present disclosure. In another embodiment, the interconnect device 200 includes dielectric diffusion barrier layer 204. It is noted that the dielectric diffusion layer 204 may be formed with any suitable layer described in the present disclosure. In another embodiment, the interconnect device 200 includes an etch stop layer 206. It is noted that the etch stop layer 206 may be formed with any suitable layer described in the present disclosure.

The interconnect device 200 may include any type of interconnect device known in the art. For example, the interconnect device 200 may include, but is not limited to, an MPU, an ASIC, a Flash memory and the like. In this regard, one or more of the films/materials disclosed in the present disclosure may form one or more portions of an MPU, an ASIC, or a Flash memory.

Figure 2B:
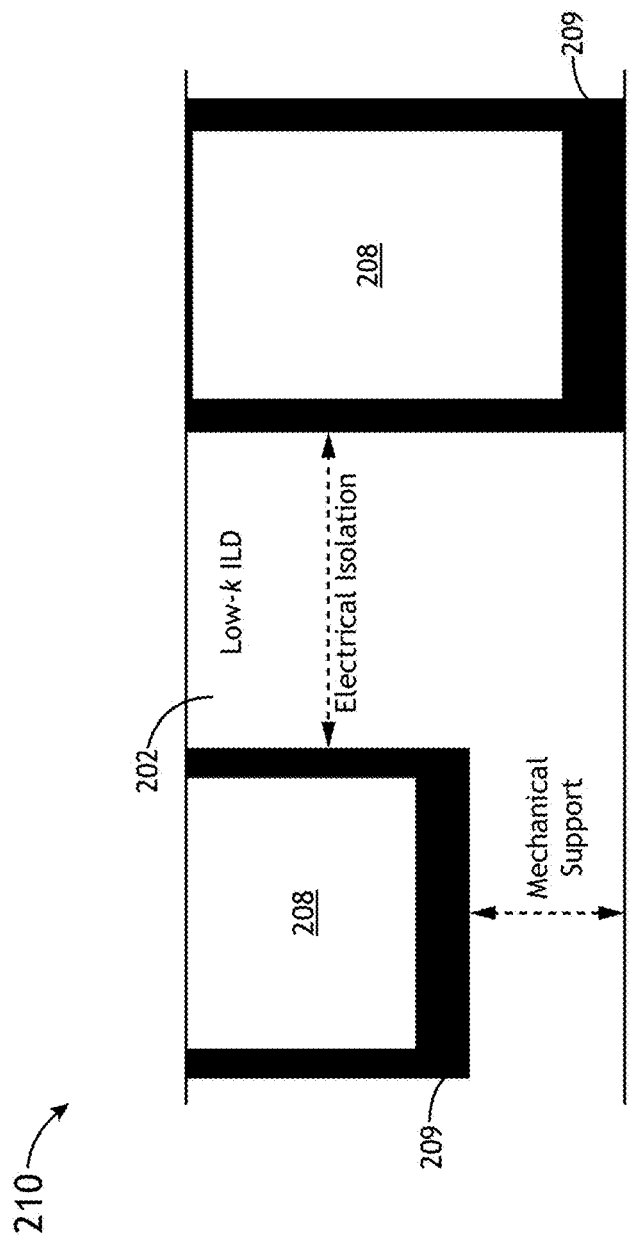
FIG. 2B is a simplified schematic view of a metal interconnect device equipped with a low-k interlayer dielectric, in accordance with one embodiment of the present disclosure.

FIG. 2B illustrates a simplified cross-sectional view 210 of the implementation of a low-k interlayer dielectric (ILD) 202, in accordance with one or more embodiments of the present disclosure. In one embodiment, the low-k dielectric 202 provides electric isolation between the metal contacts (e.g., Cu) as well as mechanical support. In another embodiment, the metal interconnects 208 are coated in a barrier layer 209 (e.g., Ta/TaN) to reduce diffusion from the metal interconnects (e.g., Cu interconnects). It is noted that in the ILD 202 of FIG. 2B it is advantageous to utilize a low-k material that has a very low dielectric constant, a very low leakage current and also possesses acceptable mechanical properties. Again, applicant notes that various films of the present disclosure may be tuned for use as an ILD 202 in the interconnect device 200.

Figure 2C:
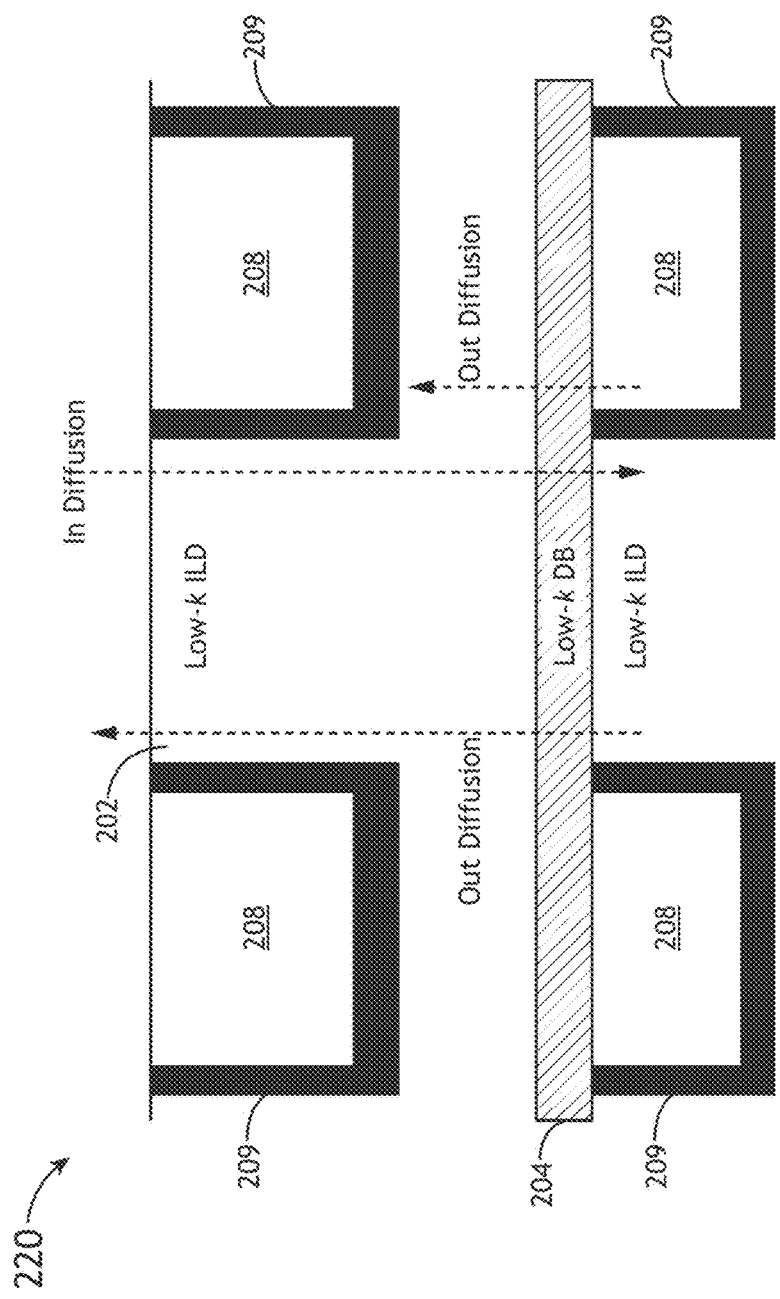
FIG. 2C is a simplified schematic view of a metal interconnect device equipped with a low-k dielectric diffusion barrier, in accordance with one embodiment of the present disclosure.

FIG. 2C illustrates a simplified cross-sectional view 220 of the implementation of a low-k dielectric diffusion barrier (DDB) 204, in accordance with one or more embodiments of the present disclosure. It is noted that it is advantageous to form the DDB 204 of FIG. 2C with a material having a moderately low dielectric constant, a low leakage current, and good diffusion mitigation properties with acceptable mechanical properties. Again, applicant notes that various films of the present disclosure may be tuned for use as a DDB 204 in the interconnect device 200.

Figure 2D:
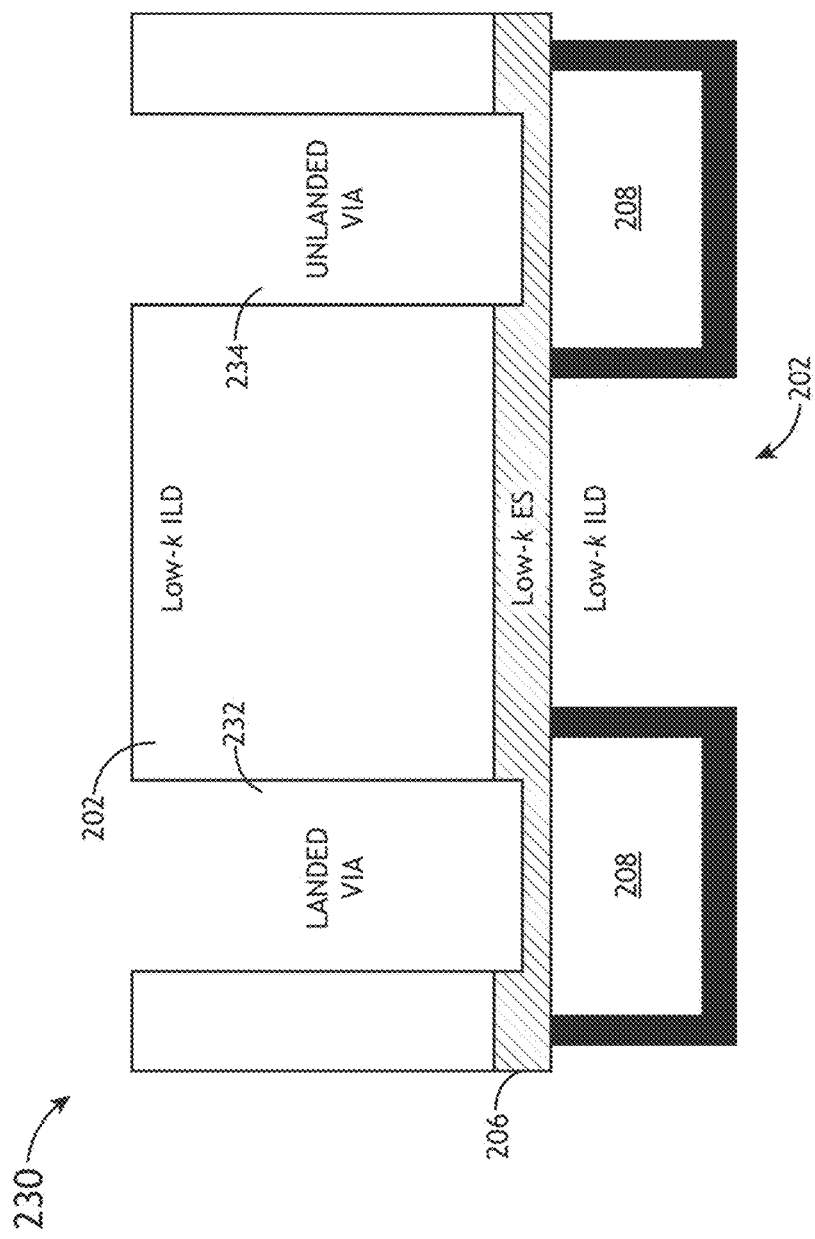
FIG. 2D is a simplified schematic view of a metal interconnect device equipped with a low-k etch stop layer, in accordance with one embodiment of the present disclosure.

FIG. 2D illustrates a simplified cross-sectional view 230 of the implementation of a low-k etch stop layer (ESL) 206, in accordance with one or more embodiments of the present disclosure. It is noted that it is advantageous to form the ESL 206 of FIG. 2D with a material having a moderately low dielectric constant, a low leakage current, appropriate etch selectivity and acceptable mechanical properties. Again, applicant notes that various films of the present disclosure may be tuned for use as an ESL 206 in the interconnect device 200.

It is noted that the scope of the present disclosure is not limited to the features depicted in FIGS. 2A-2D, which were provided merely for illustrative purposes. It is noted that the various amorphous hydrogenated boron carbide films (carbon-enriched and non-carbon-enriched) may be used to construct one or more of the following interconnect features: low-k inter/intra-layer dielectric, etch stop layer, metal capping layer, dielectric diffusion barrier, dielectric capping layer (i.e., a protective dielectric that caps another more sensitive dielectric), a hard mask (e.g., non-sacrificial hardmask), a spacing layer and a specialized low-k dielectric layer.

Interconnect devices and their various features are generally described in Grill et al., Progress in the development and understanding of advanced low k and ultralow k dielectrics for very large-scale integrated interconnects—State of the art. *Appl. Phys. Rev.* 1, 011306 (2014), which is incorporated herein by reference in the entirety.

Dielectric barriers, etch stops and metal capping materials are generally described in King, S. W. Dielectric Barrier, Etch Stop, and Metal Capping Materials for State of the Art and beyond Metal Interconnects. *ECS J. Solid State Sci. Technol.* 4, N3029-N3047 (2015), which is incorporated herein by reference in the entirety.

While much of the present disclosure has focused on the implementation of the films/materials of the present disclosure in the context of the metal interconnects of an interconnect-based device, this is not a limitation on the present disclosure. It is contemplated herein that the films/materials of the present disclosure may be extended to any context requiring a low-k dielectric material.

Figure 3A:
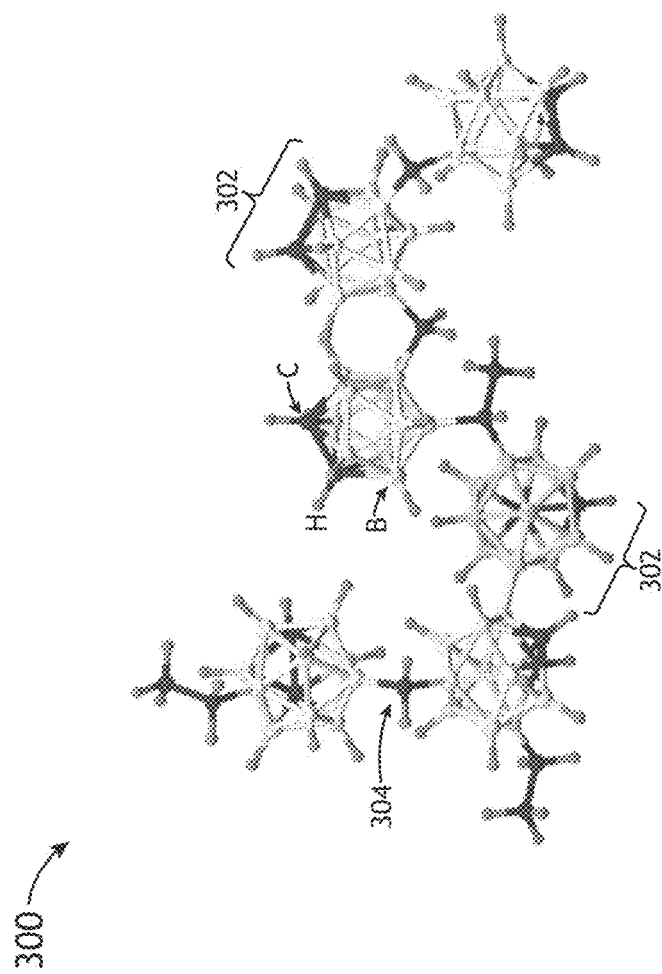
FIG. 3A is a schematic view of the local structure of amorphous hydrogenated boron carbide, in accordance with one embodiment of the present disclosure.

FIG. 3A illustrates a depiction of the local physical structure 300 of the amorphous hydrogenated boron carbide material deposited by system 100, in accordance with one or more embodiments of the present disclosure. It is noted that the local physical structure depicted in view 300 was deduced with the use of magic angle spinning solid-state nuclear magnetic resonance (NMR) spectroscopy. In one embodiment, the local physical structure 300 is dominated by predominantly hydrogenated carborane icosahedra 302. The icosahedra may be lightly cross-linked via nonhydrogenated intraicosahedral B atoms, either directly through B—B bonds or through extraicosahedral hydrocarbon chains 304. The local physical structure is described in detail in Paquette, M. M. et al. The local physical structure of amorphous hydrogenated boron carbide: insights from magic angle spinning solid-state NMR spectroscopy. *J. Phys. Condens. Matter* 23, 435002 (2011), which is incorporated herein by reference in the entirety.

Figure 3B:
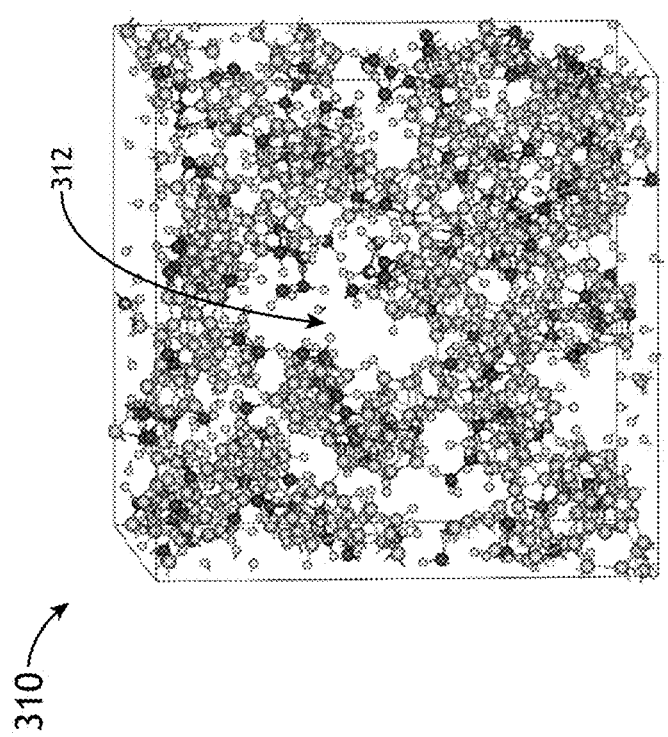
FIG. 3B is a schematic view of the bulk structure of amorphous boron carborane in a low density state, in accordance with one embodiment of the present disclosure.

FIG. 3B illustrates a depiction of the bulk physical structure 310 of amorphous hydrogenated boron carbide material in a low density state, in accordance with one or more embodiments of the present disclosure. It is noted that through the variation of the fabrication parameters applied throughout the present disclosure a range of properties of the amorphous hydrogenated boron carbide (carbon-enriched and non-enriched) may be achieved. The modeled bulk material of FIG. 3B displays a density of 0.9 g/cm$^3$ with approximate stoichiometry of a-$B_{35}C:H_3$. In addition, the low-density form of the material 310 displays significant pores 312 with diameters on the order of 0.7 nm. In contrast, in a high density non-porous hard state (not shown), the material displays a density of 2.4 g/cm$^3$ with approximate stoichiometry of a-$B_{4.5}C:H$. By varying growth temperature and R.F. power (among other properties) a range of a-B$_x$C:H$_y$ variants are accessible, which display differences in chemical composition and mechanical properties. The bulk structure of the amorphous hydrogenated boron carbide material is described in Nordell, B. J. et al. The Influence of Hydrogen on the Chemical, Mechanical, Optical/Electronic, and Electrical Transport Properties of Amorphous Hydrogenated Boron Carbide. *J. Appl. Phys.* 118, 035703 (2015), which is incorporated herein by reference in the entirety.

Figure 4A:
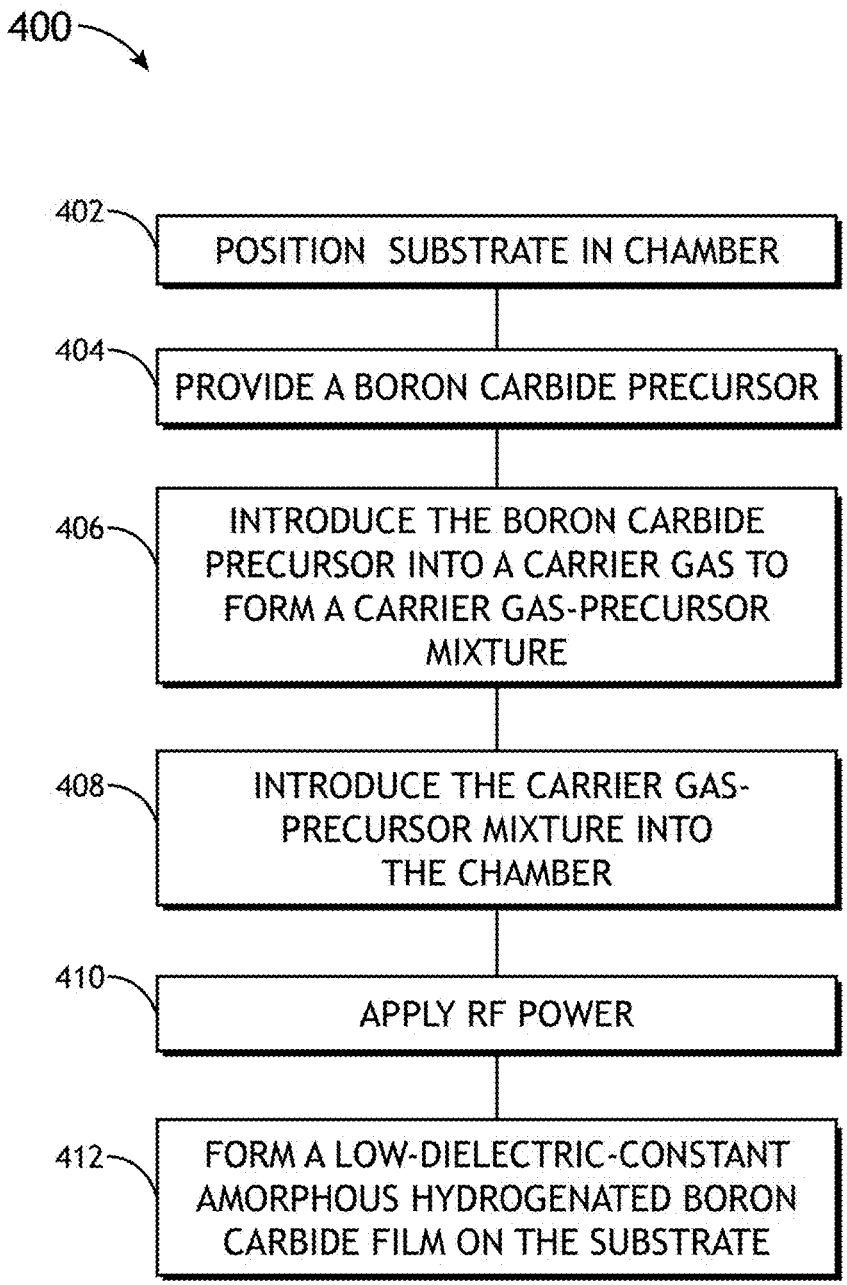
FIG. 4A is a process flow diagram depicting a method of forming a low-dielectric-constant amorphous hydrogenated boron carbide film on a substrate, in accordance with one embodiment of the present disclosure.

FIG. 4A illustrates a process flow diagram depicting a method 400 for forming low-dielectric-constant amorphous hydrogenated boron carbide, in accordance with one or more embodiments of the present disclosure.

It is noted herein that the steps of method 400 may be implemented all or in part by system 100 of FIGS. 1A-1D. It is further recognized, however, that the method 400 is not limited to the system 100 in that additional or alternative system-level embodiments may carry out all or part of the steps of method 400.

In step 402, the substrate 102 is positioned within the PECVD chamber 101. For example, the substrate 102 may be prepared with any necessary preparation steps (e.g., cleaning, device layer fabrication and the like). Then, the substrate 102 may be transferred into the PECVD chamber 101 and onto the substrate holder 104 (e.g., chuck) via the substrate handler 148. The substrate 102 may be heated to a selected temperature for processing. For example, substrate heater 118 may heat the substrate 102 to a selected temperature between 50 and 600° C. More particularly, substrate heater 118 may heat the substrate 102 to a selected temperature between 125 and 350° C.

In step 404, a boron carbide precursor 110 is provided. The boron carbide precursor 110 may include any boron carbide source known in the art. In one embodiment, the boron carbide source 110 may include a solid precursor material. For example, the solid boron carbide precursor may be provided in powder form. The boron carbide source 110 may include, but is not limited to, a single-molecule boron and carbon source, such as, but not limited to, one or more carboranes. For instance, the boron carbide precursor 110 may include, but is not limited to, ortho-carborane (1,2-C$_2$B$_{10}$H$_{12}$). For instance, the boron carbide precursor 110 may include, but is not limited to, meta-carborane (1,7-C$_2$B$_{10}$H$_{12}$). For instance, the boron carbide precursor 110 may include, but is not limited to, para-carborane (1,12-C$_2$B$_{10}$H$_{12}$).

In another embodiment, a selected amount of the solid precursor is disposed within the bubbler unit 128. For example, the solid precursor 110 may be disposed on mesh element 130, which is situated above the stack of spheres 131 of the bubbler unit 128.

As discussed previously herein, alternatively and/or additionally, the boron carbide precursor 110 may include a liquid precursor or gaseous precursor.

In step 406, a portion of the boron carbide precursor 110 is introduced into a carrier gas to form a carrier gas-precursor mixture 134. In one embodiment, the carrier gas includes Argon (Ar). In one embodiment, the carrier gas 132 is transported through the boron carbide precursor 110. In another embodiment, the carrier gas 132 may be heated to a selected temperature prior to transport through the boron carbide precursor. The carrier gas may be heated to a temperature between 25 and 300° C. More particularly, the carrier gas may be heated to a temperature of approximately 75° C. For example, as shown in FIG. 1E, the carrier gas 132 is transported through bubbler unit 128, which contains the boron carbide precursor 110. In the case of a solid precursor, as the carrier gas is transported through the boron carbide precursor, the boron carbide precursor sublimes into the carrier gas, resulting in a boron carbide precursor/carrier gas mixture 134.

In one embodiment, the carrier gas-precursor mixture 134 is mixed with substantially pure carrier gas from the additional delivery line 125 in mixing chamber 144. In this regard, the partial flow rate represented by the carrier gas-precursor mixture 134 from line 123 may be controlled relative to the total flow rate, which is sum of the carrier gas flow rate from line 123 and 125. In one embodiment, the flow rate of gas along delivery lines 123 and/125 may be controlled via mass flow controllers 138, 140. For example, one or more of the mass controllers 138, 140 may provide a mass flow rate of the carrier gas of between 10 and 500 sccm (e.g., 200 sccm). By way of another example, one or more of the mass controllers 138, 140 may provide a partial mass flow rate of the carrier gas flowing through the precursor between 0.1 and 1.

In the case of liquid precursor material, the liquid precursor material may be introduced into the carrier gas via evaporation (e.g., via a liquid bubbler unit positioned along the delivery line 123). Alternatively, the liquid precursor material may be introduced into the PECVD chamber 101 directly, whereby the liquid precursor evaporates directly into the process gas (e.g., Ar) of the system 100. In the case of gaseous precursor material or materials, the gaseous material may be introduced into the PECVD chamber 101 directly, whereby the gaseous precursor or precursors are mixed with the process gas of the PECVD system 100.

In step 408, the carrier gas-precursor mixture 134 is introduced into the PECVD chamber 101. In one embodiment, following uptake of the boron carbide precursor 110, the carrier gas 134 is transported to the precursor delivery unit 103 (e.g., showerhead) via delivery line 126. In turn, the precursor delivery unit 103 distributes the carrier gas-precursor mixture 134 into the plasma generation region of chamber 101. In another embodiment, following uptake of the boron carbide precursor 110, the carrier gas 134 is transported into the chamber 101 via the additional delivery line 136 (e.g., purge line) to the PECVD chamber 101.

The gas pressure within the PECVD chamber 101 may be maintained between a pressure of 0.1 and 760 Torr. More particularly, the gas pressure may be maintained between a pressure of 0.1 and 5 Torr. Even more particularly, the gas pressure may be maintained at approximately 1 and 3 Torr.

In another embodiment, the carrier gas-precursor mixture 134 is heated by one or more of the delivery lines 126, 136 and/or the precursor delivery unit 103. For example, the carrier gas-precursor mixture 134 may be heated to a temperature between 25 and 300° C. by one or more of the delivery lines 126, 136 and/or the precursor delivery unit 103. More particularly, the carrier gas-precursor mixture 134 may be heated to a temperature between 70 and 80° C. by one or more of the delivery lines 126, 136 and/or the precursor delivery unit 103.

In step 410, RF power is applied to the carrier gas-precursor mixture 134 within the PECVD chamber 101. For example, RF power is applied to the carrier gas-precursor mixture 134 as it is distributed by the precursor delivery unit 103 to form plasma. For instance, the application of RF power to the carrier gas-precursor mixture 134 may form one or more plasmas containing one or more free radicals and/or one or more ions containing boron, carbon and/or hydrogen. In the case of an ortho-carborane precursor, as RF power is applied to the ortho-carborane emitted by the precursor delivery unit 103, the applied RF power acts to form one or more plasmas 105 containing boron, carbon and/or hydrogen free radicals. In one embodiment, the RF power is supplied to the RF generator 122 and matching network 124, which are coupled to the substrate holder 104 and precursory delivery unit 103, which serve as an anode and cathode respectively. The RF generator 122 and matching network 124 may supply RF power at levels between 1 and 50 W. More particularly, the RF generator 122 and matching network 124 may supply RF power at levels between 20 and 40 W. The system 100 may apply an RF power density between 1 and 1000 mW/cm$^2$.

In step 412, a low-dielectric-constant amorphous hydrogenated boron carbide film is formed on the substrate 102. In one embodiment, the plasma 105 is directed to the surface of the substrate 102 resulting in the formation of a film or layer of amorphous hydrogenated boron carbide. As noted previously herein, by varying the various flow, chamber and plasma generation parameters, the characteristics of the formed films may be varied.

As depicted in FIGS. 2A-2D, the low-dielectric-constant amorphous hydrogenated boron film/layer forms a portion of an interconnect device 200. Further, the film/layer formed by method 400 forms one or more of an interlayer dielectric layer, an intralayer dielectric layer, an etch stop layer, a dielectric diffusion barrier, a metal capping layer, a hardmask, a dielectric capping layer, or a spacer layer of an interconnect device. The interconnect device may include, but is not limited to, an MPU device, an ASIC device, or a flash memory device.

In another embodiment, following the formation of the low-dielectric-constant amorphous hydrogenated boron carbide film on the substrate 102, the method may include one or more additional process steps. For example, the one or more additional process steps may include, but are not limited to, a thermal processing step, a chemical processing step, or a photo processing step (e.g., ultraviolet light exposure).

The variation of the system parameters and the resulting film characteristics are discussed in additional detail further herein (see Table 1A/1B).

Figure 4B:
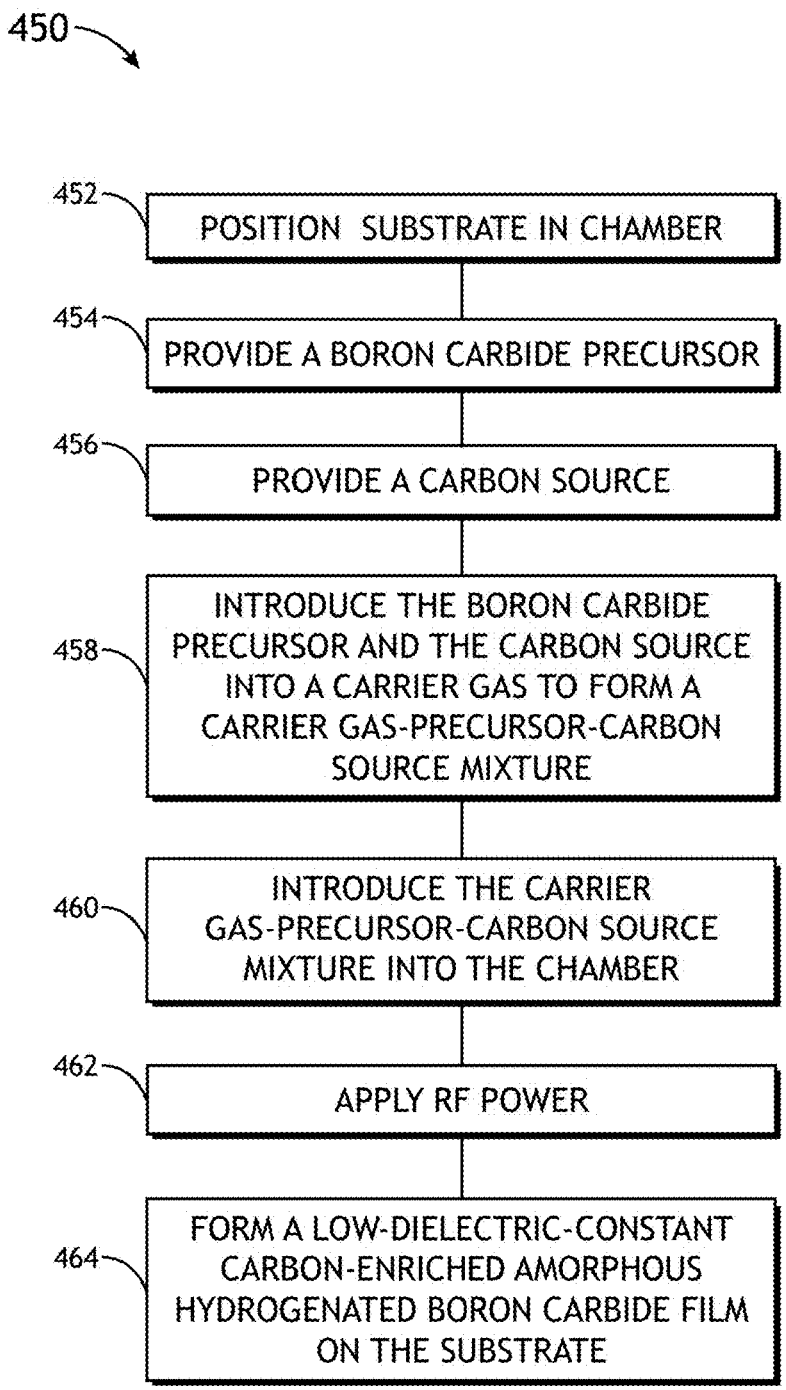
FIG. 4B is a process flow diagram depicting a method forming a low-dielectric-constant amorphous hydrogenated and carbon-enriched boron carbide film on a substrate, in accordance with one embodiment of the present disclosure.

FIG. 4B illustrates a process flow diagram depicting a method 450 for forming carbon-enriched low-dielectric-constant amorphous hydrogenated boron carbide, in accordance with one or more embodiments of the present disclosure.

It is noted herein that the steps of method 450 may be implemented all or in part by system 100. It is further recognized, however, that the method 450 is not limited to the system 100 in that additional or alternative system-level embodiments may carry out all or part of the steps of method 450. In addition, it is noted that the description of the various embodiments and steps of method 400 should be interpreted to extend to method 450 unless otherwise noted.

In step 452, the substrate 102 is positioned in the PECVD chamber 101. As described in method 400, the substrate 102 may be prepared with any necessary preparation steps (e.g., cleaning, device layer fabrication and the like). Then, the substrate 102 may be transferred into the PECVD chamber 101 and onto the substrate holder 104 (e.g., chuck) via the substrate handler 148. The substrate 102 may be heated to a selected temperature for processing. For example, substrate heater 118 may heat the substrate 102 to a selected temperature between 50 and 600° C. More particularly, in method 450, the substrate heater 118 may heat the substrate 102 to a selected temperature between 175 and 275° C.

In step 454, a boron carbide precursor 110 is provided. In one embodiment, the boron carbide precursor 110 may include a solid precursor material. For example, as noted in the description of method 400, the solid boron carbide precursor may be provided in powder form. The boron carbide source 110 may include, but is not limited to, a single molecule boron and carbon source, such as, but not limited to, one or more carboranes. For instance, the boron carbide precursor 110 may include, but is not limited to, single source ortho-carborane (1,2-$C_2B_{10}B_{12}$). As discussed previously herein, alternatively and/or additionally, the boron carbide precursor 110 may include a liquid precursor or gaseous precursor.

In step 456, a carbon source 112 is provided. In one embodiment, the carbon source 112 may include a single-molecule carbon source 112. In one embodiment, the carbon source 112 may be provided in gaseous form. In one embodiment, the carbon source 112 may include, but is not limited to, a hydrocarbon source. For example, the carbon source 112 may include, but is not limited to, methane, ethylene, acetylene or ethane. In the case of gaseous hydrocarbons, the carbon source 112 need not be coupled directly to a carrier gas source (such as 114a, 114b).

In step 458, the boron carbide precursor and the carbon source are introduced into a carrier gas to form a carrier gas-precursor-carbon source mixture. In one embodiment, the carrier gas 132 is transported through the boron carbide precursor 110. In another embodiment, the carrier gas 132 may be heated to a selected temperature prior to transport through the boron carbide source. The carrier gas may be heated to a temperature between 25 and 300° C. More particularly, the carrier gas may be heated to a temperature of approximately 75° C. For example, as shown in FIG. 1E, the carrier gas 132 is transported through bubbler unit 128, which contains the boron carbide precursor 110. In the case of a solid precursor, as the carrier gas is transported through the boron carbide precursor, the boron carbide precursor sublimes into the carrier gas, resulting in a boron carbide precursor/carrier gas mixture 134.

The carbon source 112 may be delivered to the mixing chamber 144. In this regard, the gaseous carbon source 112 may be transported to the mixing chamber 144 where it is then mixed with the precursor-carrier gas mixture from delivery line 123. The carbon source may be mixed with the precursor-carrier gas mixture in any suitable proportion. For example, in the case of methane, applicants have shown that providing a partial flow of methane between 1 and 50%, such as between 2.5 and 10%, of the total flow rate of the carrier gas flow (carrying the precursor) provides high quality carbon-enriched amorphous hydrogenated boron carbide films, as discussed further herein In step 460, the carrier gas-precursor-carbon source mixture is introduced into the PECVD chamber 101. In one embodiment, following uptake of the boron carbide precursor 110 and mixture with the carbon source 112, the carrier gas is transported to the precursor delivery unit 103 (e.g., showerhead) via delivery line 126. In turn, the precursor delivery unit 103 distributes the carrier gas-precursor-carbon source mixture into the plasma generation region of chamber 101. In another embodiment, the carrier gas is transported into the chamber 101 via the additional delivery line 136 (e.g., purge line) to the PECVD chamber 101.

In step 462, RF power is applied to the carrier gas-precursor-carbon source mixture within the PECVD chamber 101. As discussed previously herein, the application of RF power to the carrier gas-precursor-carbon source mixture may form one or more plasmas containing one or more free radicals and/or one or more ions containing boron, carbon and/or hydrogen.

In step 464, a carbon-enriched low-dielectric-constant amorphous hydrogenated and carbon-enriched boron carbide film is formed on the substrate 102. In one embodiment, the plasma 105 is directed to the surface of the substrate 102 resulting in the formation of a film or layer of carbon-enriched amorphous hydrogenated boron carbide. As noted previously herein, by varying the various flow, chamber and plasma generation parameters, the characteristics of the formed films may be varied.

Tables 1A and 1B provided below provide various process conditions and properties of resulting amorphous hydrogenated boron carbide films formed via the embodiments of the present disclosure.

to-carbon ratio, percentage of constituent elements of each film by atomic weight, film density, Young's modulus (E), hardness (H), high frequency dielectric constant ($\epsilon 1$), low frequency dielectric constant (k), k-$\epsilon 1$, electrical resistivity ($\varphi$ and leakage current density (J).

It is noted that films formed with methane as a source for carbon enrichment and films formed without carbon enrichment are listed in Table I. For example, representative Film No. 11 was formed with a 200 sscm partial flow rate of argon through an ortho-carborane source with no methane flow. By way of another example, Film No. 13 was formed with a 190 sscm partial flow rate of argon/ortho-carborane source flow and 10 sscm methane flow. It is noted herein that for the purposes of Tables 1A and 1B, the "partial flow" represents

TABLE 1A

| Film no. | T °C. | P W | p Torr | Tot. Flow sccm | Part. Flow | CH$_4$ flow | d (nm) | Growth rate (nm/min) |
|---|---|---|---|---|---|---|---|---|
| 1 | 250 | 10 | 0.4 | 100 | 90 | 10 | 566 | 47 |
| 2 | 250 | 10 | 0.4 | 100 | 50 | 50 | 381 | 32 |
| 3 | 250 | 10 | 0.4 | 100 | 100 | 0 | 152 | 13 |
| 4 | 250 | 40 | 2 | 100 | 90 | 10 | 192 | 16 |
| 5 | 250 | 40 | 2 | 100 | 100 | 0 | 60 | 5 |
| 6 | 250 | 40 | 2 | 200 | 180 | 20 | 213 | 18 |
| 7 | 250 | 40 | 2 | 200 | 150 | 50 | 436 | 36 |
| 8 | 250 | 40 | 2 | 200 | 100 | 100 | 466 | 39 |
| 9 | 275 | 40 | 2 | 200 | 195 | 5 | 149 | 12 |
| 10 | 275 | 40 | 2 | 200 | 180 | 20 | 110 | 9 |
| 11 | 275 | 40 | 2 | 200 | 200 | 0 | 200 | 17 |
| 12 | 275 | 20 | 2 | 200 | 195 | 5 | 583 | 49 |
| 13 | 275 | 20 | 2 | 200 | 190 | 10 | 244 | 20 |
| 14 | 275 | 20 | 2 | 200 | 200 | 0 | 176 | 15 |
| 15 | 175 | 20 | 2 | 200 | 195 | 5 | 523 | 44 |
| 16 | 400 | 10 | 0.4 | 100 | 90 | 10 | 510 | 43 |
| 17 | 400 | 10 | 0.4 | 100 | 50 | 50 | 150 | 13 |
| 18 | 400 | 10 | 0.4 | 100 | 100 | 0 | 844 | 70 |

TABLE 1B

| Film no. | B/C | B | C | O | H | Dens. (g/cm$^3$) | E (GPa) | H (GPa) | $\epsilon_1$ | k | k - $\epsilon_1$ | $\rho$ ($\Omega \cdot$ cm) | J @ 2 MV/cm (A/cm$^2$) |
|---|---|---|---|---|---|---|---|---|---|---|---|---|---|
| 1 | 2.5 | 32.3 | 12.7 | 7.3 | 47.7 | 1.17 | 12.1 (±1.4) | 0.71 (±0.04) | 2.7 | 3.1 | 0.4 | 4 × 10$^{13}$ | 4 × 10$^{-6}$ |
| 2 | 3.9 | 39.0 | 10.1 | 5.5 | 45.4 | 1.20 | 9.3 (±0.7) | 0.57 (±0.04) | 2.5 | 3.3 | 0.8 | 4 × 10$^{13}$ | 6 × 10$^{-6}$ |
| 3 | — | — | — | — | — | — | — | — | 2.9 | 3.2 | 0.3 | 1 × 10$^{14}$ | 2 × 10$^{-7}$ |
| 4 | 1.3 | 25.2 | 18.8 | 10.3 | 45.7 | 1.22 | 7.7 (±2.1) | 0.70 (±0.07) | 2.4 | 2.8 | 0.4 | 1 × 10$^{14}$ | 4 × 10$^{-7}$ |
| 5 | 4.1 | 50.1 | 12.2 | 6.0 | 31.6 | 1.63 | 34 (±2) | 4.1 (±0.3) | 3.5 | 3.7 | 0.2 | 4 × 10$^{13}$ | 8 × 10$^{-8}$ |
| 6 | 0.9 | 19.9 | 22.6 | 7.0 | 50.5 | 1.15 | 15.5 (±2.7) | 0.78 (±0.06) | 2.4 | 2.7 | 0.3 | 4 × 10$^{13}$ | 4 × 10$^{-6}$ |
| 7 | 0.7 | 17.2 | 23.6 | 4.9 | 54.3 | 1.18 | 12.0 (±1.5) | 0.49 (±0.02) | 2.5 | 3.1 | 0.6 | 3 × 10$^{13}$ | 4 × 10$^{-9}$ |
| 8 | — | — | — | — | — | — | 12.9 (±0.5) | 0.67 (±0.04) | 2.5 | 3.5 | 1.0 | 3 × 10$^{13}$ | 1 × 10$^{-8}$ |
| 9 | 2.1 | 35.0 | 17.0 | 3.4 | 44.6 | 1.29 | — | — | 2.7 | 3.0 | 0.3 | 5 × 10$^{13}$ | 7 × 10$^{-8}$ |
| 10 | — | — | — | — | — | — | — | — | 2.8 | $a$ | $a$ | $a$ | $a$ |
| 11 | 4.7 | 46.9 | 10.2 | 5.5 | 37.5 | 1.44 | 126 (±4) | 8.6 (±0.04) | 3.0 | 3.3 | 0.3 | 5 × 10$^{14}$ | 5 × 10$^{-9}$ |
| 12 | 3.8 | 33.8 | 8.8 | 15.6 | 41.8 | 1.12 | — | — | 2.4 | 2.7 | 0.3 | 1 × 10$^{13}$ | 3 × 10$^{-7}$ |
| 13 | 1.6 | 29.1 | 17.9 | 9.8 | 43.1 | 0.91 | — | — | 2.2 | 2.5 | 0.3 | 1 × 10$^{14}$ | 2 × 10$^{-9}$ |
| 14 | 2.9 | 36.1 | 12.4 | 8.2 | 43.3 | 1.29 | — | — | 2.7 | 3.0 | 0.3 | 3 × 10$^{13}$ | 4 × 10$^{-8}$ |
| 15 | 3.4 | 34.0 | 10.0 | 11.6 | 44.4 | 1.08 | — | — | 2.2 | 2.5 | 0.3 | 1 × 10$^{14}$ | 1 × 10$^{-9}$ |
| 16 | 2.5 | 33.2 | 13.1 | 13.6 | 40.1 | 0.84 | — | — | 2.7 | 3.2 | 0.5 | — | 3 × 10$^{-6}$ |
| 17 | 1.6 | 24.7 | 15.9 | 13.6 | 45.8 | 0.98 | — | — | 2.4 | 2.8 | 0.4 | — | — |
| 18 | 4.9 | 49.2 | 10.0 | 4.0 | 36.9 | 1.51 | — | — | 3.4 | 4.0 | 0.6 | 4 × 10$^{15}$ | 2 × 10$^{-7}$ |

As shown above, Applicants have formed amorphous hydrogenated boron carbide films across a number of fabrication parameters including, but not limited to, growth temperature, RF power, chamber pressure, total carrier gas flow rate, partial flow rate of carrier gas including ortho-carborane precursor and methane flow rate. After and/or during fabricating the various films, Applicants tested a number of film properties. These film properties include, but are not limited to, film thickness, film growth rate, boron-the amount of flow (in sccm) flowing through the bubbler unit 128 containing the ortho-carborane precursor. For purposes of clarity, it is noted herein that throughout the present disclosure "partial flow" is often presented as a relative partial flow of the carrier gas flowed through the bubbler unit 128 relative to the total carrier gas flow. The "CH$_4$ flow" is the relative partial flow of methane (in %) relative to the total flow of carrier gas.

Results—No Carbon Enrichment

The following discussion relates to amorphous hydrogenated boron carbide films formed without an additional carbon source flow.

In one embodiment, the parameters of the system 100 have been varied to form an amorphous hydrogenated boron carbide layer having a boron-carbon ratio between 0.5 and 6.0. More particularly, the parameters of the system 100 have been varied to form an amorphous hydrogenated boron carbide layer having a boron-carbon ratio between 4.0 and 5.0.

Further, the parameters of the system 100 have been varied to form an amorphous hydrogenated boron carbide layer having a percentage (by atomic wt.) of boron, carbon and hydrogen within the following ranges: boron: 40-73%; carbon: 10-15%; hydrogen: 11-43%. More particularly, the parameters of the system 100 have been varied to form an amorphous hydrogenated boron carbide layer having a percentage (by atomic wt.) of boron, carbon, hydrogen and oxygen within the following ranges: boron: 45-55%; carbon: 10-15%; hydrogen: 25-40%; oxygen: 0-10%. Even more particularly, the parameters of the system 100 have been varied to form an amorphous hydrogenated boron carbide layer having a percentage (by atomic wt.) of boron, carbon, hydrogen, and oxygen within the following ranges: boron: 45-55%; carbon: 10-15%; hydrogen: 30-40%; and oxygen: 0-5%. It is noted that the atomic percentages of boron, carbon and hydrogen were obtained by nuclear reaction analysis and were calculated relative to total BCH composition. In addition, atomic percentage of oxygen was calculated relative to the total BCOH composition.

In another embodiment, the parameters of the system 100 have been varied to form an amorphous hydrogenated boron carbide layer having a density between 0.8 and 2.3 g/cm². More particularly, the parameters of the system 100 have been varied to form an amorphous hydrogenated boron carbide layer having a density between 1.3 and 1.8 g/cm². Even more particularly, the parameters of the system 100 have been varied to form an amorphous hydrogenated boron carbide layer having a density between 1.4 and 1.5 g/cm².

In another embodiment, the parameters of the system 100 have been varied to form an amorphous hydrogenated boron carbide layer having a Young's modulus (E) between 25 and 390 GPa. More particularly, the parameters of the system 100 have been varied to form an amorphous hydrogentated boron carbide layer having a Young's modulus between 100 and 200 GPa.

In another embodiment, the parameters of the system 100 have been varied to form an amorphous hydrogenated boron carbide layer having a hardness (H) between 1 and 28 GPa. More particularly, the parameters of the system 100 have been varied to form an amorphous hydrogenated boron carbide layer having hardness between 8 and 15 GPa. It is noted that Young's module and hardness measurements were carried out using a nanoindentation technique.

In another embodiment, the parameters of the system 100 have been varied to form an amorphous hydrogenated boron carbide layer having a high frequency dielectric constant ($\epsilon 1$) between 1.8 and 6.0. More particularly, the parameters of the system 100 have been varied to form an amorphous hydrogenated boron carbide layer having a high frequency dielectric constant between 2.7 and 3.3. Even more particularly, the parameters of the system 100 have been varied to form an amorphous hydrogenated boron carbide layer having a high frequency dielectric constant of approximately 3.0. It is noted herein that the high frequency dielectric constant ($\epsilon 1$) was measured at a frequency of $1 \times 10^{14}$ Hz. It is noted that the high frequency dielectric constant ($\epsilon 1$) was obtained utilizing an ellipsometry technique to extract $\epsilon 1$.

In another embodiment, the parameters of the system 100 have been varied to form an amorphous hydrogenated boron carbide layer having a low frequency dielectric constant ($\kappa$) between 2.4 and 7.0. More particularly, the parameters of the system 100 have been varied to form an amorphous hydrogenated boron carbide layer having a low frequency dielectric constant between 3.0 and 3.8. Even more particularly, the parameters of the system 100 have been varied to form an amorphous hydrogenated boron carbide layer having a low frequency dielectric constant of approximately 3.3. It is noted herein that the low frequency dielectric constant ($\kappa$) was measured at a frequency of $1 \times 10^6$ Hz. It is noted that the low frequency dielectric constant ($\kappa$) was obtained utilizing capacitance-voltage measurements performed with a mercury probe.

In another embodiment, the parameters of the system 100 have been varied to form an amorphous hydrogenated boron carbide layer displaying electrical resistivity ($\rho$) between $10^9$ and $10^{15}$ $\Omega$-cm. More particularly, the parameters of the system 100 have been varied to form an amorphous hydrogenated boron carbide layer displaying $\rho$ between $10^{14}$ and $10^{15}$ $\Omega$-cm. Even more particularly, the parameters of the system 100 have been varied to form an amorphous hydrogenated boron carbide layer displaying $\rho$ of approximately $5 \times 10^{14}$ $\Omega$-cm.

In another embodiment, the parameters of the system 100 have been varied to form an amorphous hydrogenated boron carbide layer displaying leakage current density (J) between $10^{-9}$ and $10^{-3}$ A/cm². More particularly, the parameters of the system 100 have been varied to form an amorphous hydrogenated boron carbide layer displaying J between $10^{-9}$ and $10^{-7}$ A/cm². More particularly, the parameters of the system 100 have been varied to form an amorphous hydrogenated boron carbide layer displaying J between $10^{-9}$ and $10^{-8}$ A/cm². For example, the parameters of the system 100 have been varied to form an amorphous hydrogenated boron carbide layer displaying J of approximately $5 \times 10^{-9}$ A/cm². It is noted that leakage current density measurements were performed with current-voltage measurements using a mercury probe at a test field of 2 MV/cm.

For example, a case that serves to balance the electronic/optical, electrical, mechanical, and thermal characteristics of the resulting amorphous hydrogentated boron carbide films may be formed with the following parameters: 125-350° C., 5-50 W, 0.2 to 5 Torr, and 10-500 sccm total flow rate (with no methane flow). Such conditions may lead to amorphous hydrogenated boron carbide films having the following properties: % B: 45-55; % C: 10-15: % H: 25-40; % O: 0-10%; density=1.3-1.8 g/cm³; Young's modulus=100-200 GPa; hardness=8-15 GPa; $\epsilon 1$=2.7-3.3; $\kappa$=3.0-3.8; $\rho$=$10^{14}$-$10^{15}$ $\Omega$-cm; and J=$10^{-9}$-$10^{-8}$ A/cm².

Results—Carbon Enrichment

The following discussion relates to amorphous hydrogenated boron carbide films enriched with methane flow as an additional carbon source. In one embodiment, the parameters of the system 100 have been varied to form a carbon-enriched amorphous hydrogenated boron carbide layer having a boron-carbon ratio between 0.5 and 4.0. More particularly, the parameters of the system 100 have been varied to form an amorphous hydrogenated boron carbide layer have a boron-carbon ratio between 1.5 and 4.0.

The parameters of the system 100 have been varied to form an amorphous hydrogenated boron carbide layer having a percentage (by atomic wt.) of boron, carbon, hydrogen and oxygen within the following ranges: boron: 20-40%;

carbon: 10-25%; hydrogen: 40-55%; and oxygen: 0-10%. More particularly, the parameters of the system 100 have been varied to form an amorphous hydrogenated boron carbide layer having a percentage (by atomic wt.) of boron, carbon, hydrogen, and oxygen within the following ranges: boron: 25-35%; carbon: 10-20%; hydrogen: 40-50%; and oxygen: 0-10%. Even more particularly, the parameters of the system 100 have been varied to form an amorphous hydrogenated boron carbide layer having a percentage (by atomic wt.) of boron, carbon and hydrogen within the following ranges: boron: 28-30%; carbon: 17-19%; hydrogen: 42-44%.

In another embodiment, the parameters of the system 100 have been varied to form an amorphous hydrogenated boron carbide layer having a density between 0.8 and 1.3 g/cm$^2$. More particularly, the parameters of the system 100 have been varied to form an amorphous hydrogenated boron carbide layer having a density between 0.8 and 1.1 g/cm$^2$. It is note that the addition of methane during the PECVD progress shows a significant reduction in the density of the resulting films.

In another embodiment, the parameters of the system 100 have been varied to form an amorphous hydrogenated boron carbide layer having a Young's modulus (E) between 7 and 16 GPa and a hardness (H) between 0.4 and 0.8 GPa.

In another embodiment, the parameters of the system 100 have been varied to form an amorphous hydrogenated boron carbide layer having a high frequency dielectric constant ($\epsilon$1) between 2.2 and 2.8. In another embodiment, the parameters of the system 100 have been varied to form an amorphous hydrogenated boron carbide layer having a low frequency dielectric constant ($\kappa$) between 2.5 and 4.0. More particularly, the parameters of the system 100 have been varied to form an amorphous hydrogenated boron carbide layer having a low frequency dielectric constant ($\kappa$) between 2.5 and 2.7.

In another embodiment, the parameters of the system 100 have been varied to form an amorphous hydrogenated boron carbide layer displaying $\rho$ between $10^9$ and $10^{15}$ $\Omega$-cm. More particularly, the parameters of the system 100 have been varied to form an amorphous hydrogenated boron carbide layer displaying $\rho$ between $3 \times 10^{13}$ and $1 \times 10^{14}$ $\Omega$-cm. The parameters of the system 100 have been varied to form an amorphous hydrogenated boron carbide layer displaying J between $1 \times 10^{-9}$ and $6 \times 10^{-7}$ A/cm$^2$.

For example, a case that serves to balance the electronic/optical, electrical, mechanical, and thermal characteristics of the resulting amorphous hydrogentated boron carbide films may be formed with the following parameters: 175-275° C., 20-40 W, 2 Torr, 100-200 sccm total flow rate, and 2.5-10% methane partial flow rate (with the remainder of flow passing through the ortho-carborane precursor). Such conditions lead to amorphous hydrogenated boron carbide films having the following properties: % B: 25-35; % C: 10-20: % H: 40-50; density=0.8-1.1 g/cm$^3$; $\epsilon$1=2.1-2.3; $\kappa$=2.5-2.7; $\rho$=$10^{13}$-$10^{14}$ Ohm-cm; J=$10^{-9}$-$10^{-7}$ A/cm$^2$.

FIGS. 5A-5D illustrate mechanical and dielectric properties of multiple hydrogenated boron carbide films formed across a number of the various parameter regimes of the present disclosure.

FIG. 5A depicts a graph of the relationship between the atomic concentration of hydrogen (by atomic wt.) and film density for a number of films formed under different processing conditions. The density spans a range of 0.8-2.3 g/cm$^3$, with the atomic concentration of hydrogen spanning 45-10%. As shown in FIG. 5A, there is significant inverse correlation between atomic concentration of hydrogen and density.

Figure 5D:
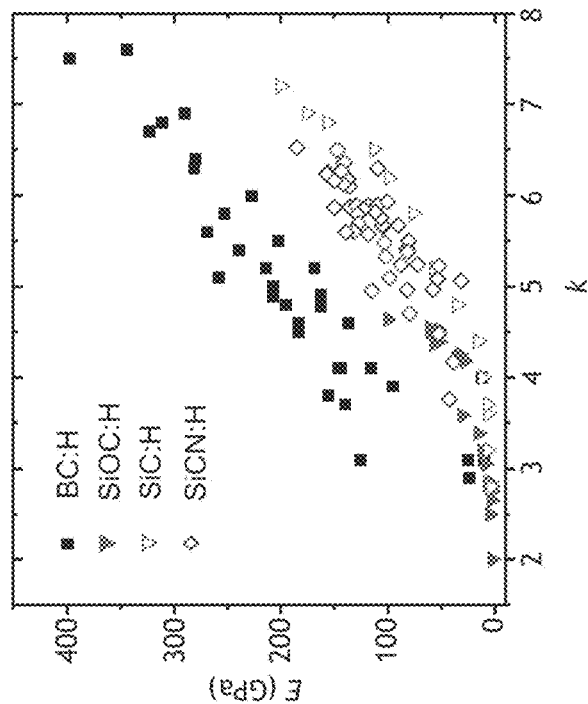
Figure 5C:
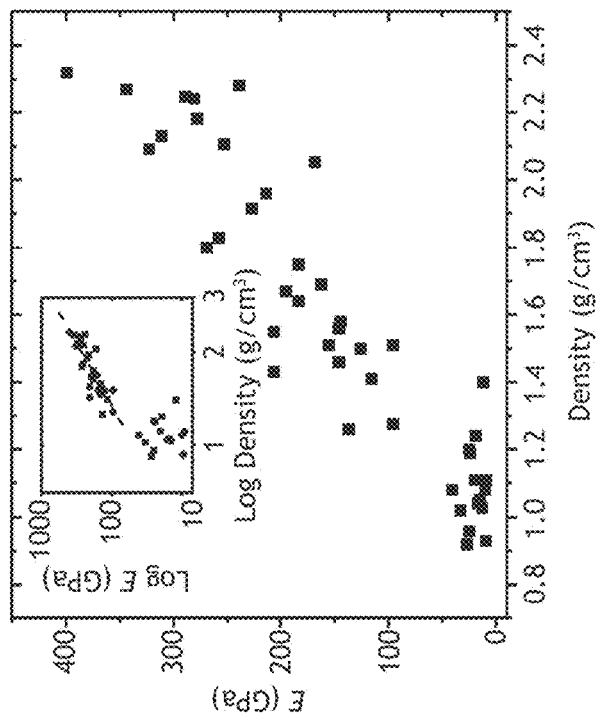

As shown in FIGS. 5B and 5C, the permittivity (high ($\epsilon_1$) and low (k) frequency dielectric constants) and stiffness (Young's modulus (E)) scale with density. In addition, while not shown here, hardness (H) scales with density. As shown in FIG. 5B, k ranges from 2.7-7.6. As shown in FIG. 5C, E ranges from 10-400 GPa. H ranges from 1-35 GPa. The behavior of hardness is described in B. J. Nordell, S. Karki, T. D. Nguyen, P. Rulis, A. N. Caruso, S. S. Purohit, H. Li, S. W. King, D. Dutta, D. Gidley, W. A. Lanford, M. M. Paquette, *J. Appl. Phys.* 2015, 118, 035703 and B. J. Nordell, C. L. Keck, T. D. Nguyen, A. N. Caruso, S. S. Purohit, W. A. Lanford, D. Dutta, D. Gidley, P. Henry, S. W. King, M. M. Paquette, *Mater. Chem. Phys.* 2016, 173, 268, which are each incorporated herein by reference in the entirety.

As shown in FIG. 5C, the Young's modulus vs density curve demonstrates a plateau, characteristic of a rigidity percolation threshold, where—as predicted by topological constraint theory—above a given average network coordination (here, occurring at a density of ~1.3 g/cm$^3$), the solid is considered 'rigid,' while below this, the solid becomes 'floppy.' Above the threshold density, a power law relationship, $E \propto D^n$, holds, with n=1.85 (see inset in FIG. 5C). This nearly quadratic relationship is characteristic of cellular solids. The dielectric constant vs density curve of FIG. 5B also shows a clear inflection point, where the slope changes below ~1.5 g/cm$^3$. An inflection point is additionally observed in the k–$\epsilon_1$ term (see inset in FIG. 5B), representing the difference between low- and high-frequency dielectric constants. This difference consistently averages ~0.5 above densities of ~1.5 g/cm$^3$, while below this density it increases to an average of ~1.5 at 0.8 g/cm$^3$. It is noted that, while $\epsilon_1$ represents the electronic contribution to the polarizability, the k–$\epsilon_1$ term represents primarily ionic and orientation contributions.

It is noted that the amorphous hydrogenated boron carbide films exhibit extremely high stiffness and hardness, even at very low densities. The superior mechanical properties of amorphous hydrogenated boron carbide are evident from the low-k death curve, illustrated in FIG. 5D for amorphous hydrogenated boron carbide alongside representative Si-based dielectrics. For higher density films (>1.3 g/cm$^3$) above the rigidity threshold, the Young's modulus ranges from ~2 to >10 times higher in amorphous hydrogenated boron carbide films than in Si-based dielectrics for any given value of k. For lower density films (<1.3 g/cm$^3$), E appears uncorrelated with density (see inset in FIG. 5C), and averages 21±9 GPa. As such, despite the tendency toward higher k values at these low densities due to a high k–$\epsilon_1$ contribution (see inset FIG. 5B), for even the lowest density films, high E values, sufficient for integration, are contemplated. The E values for the low-density amorphous hydrogenated boron carbide films are higher than in the majority of SiOC:H-type dielectrics, which typically exhibit E values in the range of 3-15 GPA for k values of 2-3.

Figure 6B:
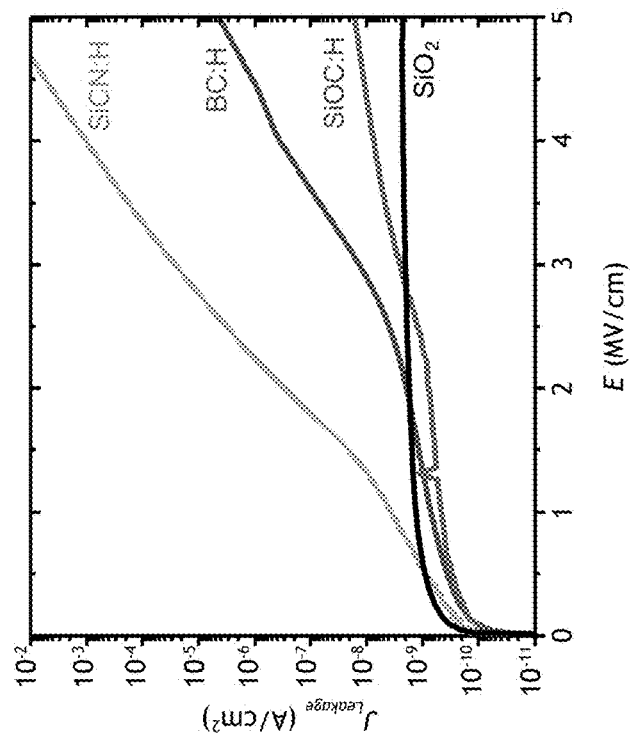
FIGS. 6A-6B illustrate electrical properties of amorphous hydrogenated boron carbide films of the present disclosure, in accordance with one or more embodiments of the present disclosure.
Figure 6A:
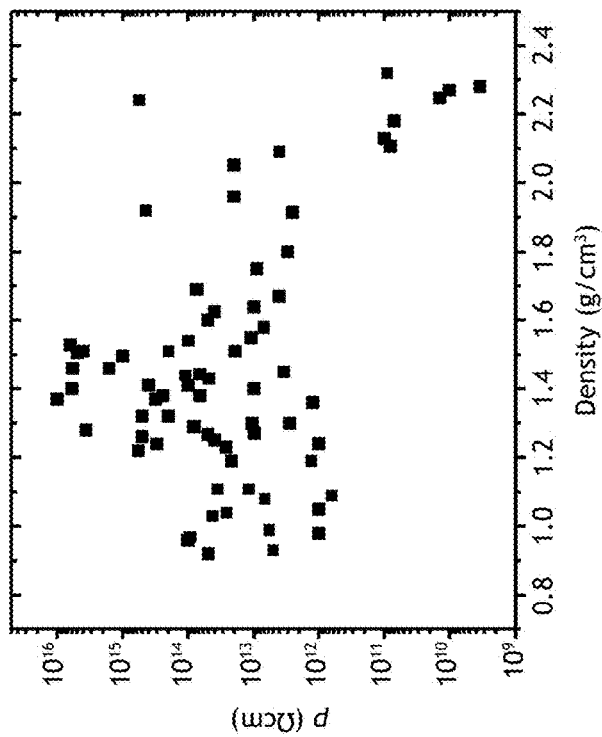

FIGS. 6A-6B illustrate electrical properties for amorphous hydrogenated boron carbide films of the present disclosure. FIG. 6A illustrates electrical resistivity as a function of the density for a number of amorphous hydrogenated boron carbide films. FIG. 6B illustrates leakage current density as a function of applied field for a characteristic amorphous hydrogenated boron carbide. The amorphous hydrogenated boron carbide film displays a breakdown voltage exceeding 5 MV/cm and leakage current density equivalent to or better than Si-based dielectrics at 2

MV/cm, and is shown here compared to representative samples of industry-standard high-density SiCN:H (k=5.9), high-density SiOC:H (k=3.0), and $SiO_2$ (k=4.4) dielectrics.

As shown in FIG. 6A, amorphous hydrogenated boron carbide films in general are highly insulating, and that electrical resistivity reaches a maximum of ~$10^{15}$ Ω·cm at ~1.4 g/cm³, just above the critical density defining the plateau in mechanical properties. Conditions were first selected from two opposite growth regimes found to minimize k: low power/low pressure and high power/high pressure. A moderate temperature range was emphasized to obtain films with maximum insulating character, but more moderate k values. By systematically testing growth conditions within these ranges, we have identified the high pressure/high power/moderate temperature regime as that producing optimal films for dielectric integration. The resulting films lie in the moderate density range (1.3-1.6 g/cm³), with k in the range of 3-4 and E in the range of 100-150 GPa. Film 11 of Table 1A/1B above, with a stoichiometry of a-$B_{4.7}C:H_{3.8}$, exhibits a leakage current, symmetric for both forward and reverse bias, equivalent to state-of-the-art $SiO_2$ and SiOC:H dielectrics (see FIG. 6B) on the order of $10^{-9}$ A/cm² at 2 MV/cm, as well as a breakdown voltage of >5 MV/cm. Film 11 also exhibits a k value of 3.3±0.15 and an E value of 126±5 GPa. Leakage current and dielectric constant have been measured for ten independently grown samples, and show very good reproducibility.

Additional film processing conditions and film properties and their relationship are described in in Nordell, B. J. et al. The Influence of Hydrogen on the Chemical, Mechanical, Optical/Electronic, and Electrical Transport Properties of Amorphous Hydrogenated Boron Carbide. *J. Appl. Phys.* 118, 035703 (2015), which is incorporated above by reference in the entirety.

Figure 7A:
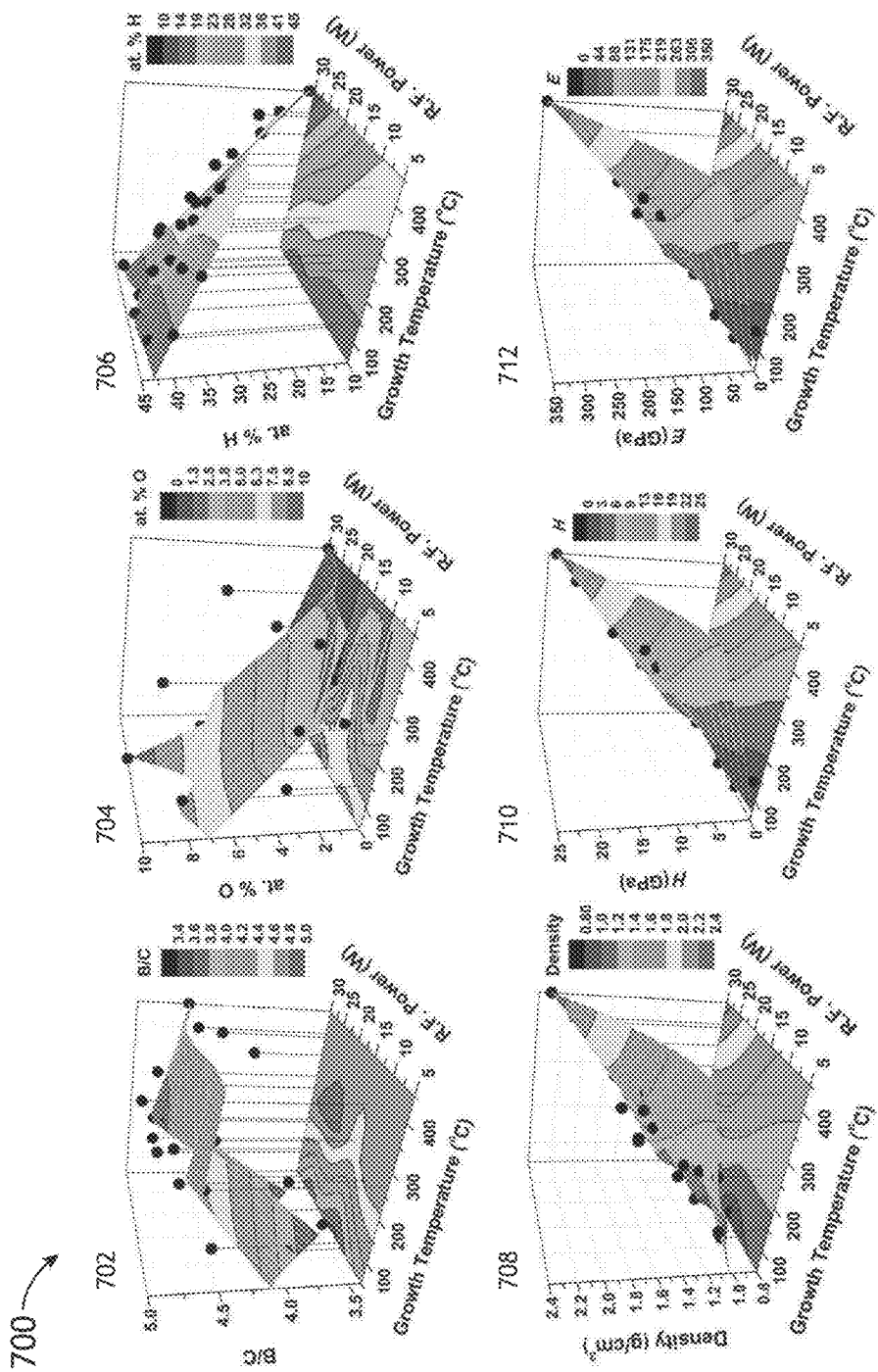
FIG. 7A illustrates a series of surface curves associated with film chemical and mechanical properties obtained from multiple amorphous hydrogenated boron carbide films as a function of film growth temperature and RF power used in the PECVD process, in accordance with one or more embodiments of the present disclosure.

FIG. 7A illustrates a series 700 of surface curves associated with film chemical and mechanical properties obtained from multiple amorphous hydrogenated boron carbide films as a function of film growth temperature and RF power used in the PECVD process. Surface curve 702 depicts the boron/carbon (B/C) ratio for the films as a function of growth temperature and RF power. Surface curve 704 depicts the atomic concentration of oxygen (at. % O) of the films as a function of growth temperature and RF power. Surface curve 706 depicts the atomic concentration of hydrogen (at. % H) of the films as a function of growth temperature and RF power. Surface curve 708 depicts the density of the films as a function of growth temperature and RF power. Surface curve 710 depicts the hardness of the films as a function of growth temperature and RF power. Surface curve 712 depicts the Young's modulus of the films as a function of growth temperature and RF power. It is noted that black circles represent data points with the shaded surfaces representing the Kriging metamodel fit.

Applicants have analyzed the effect of growth conditions on thin-film chemical composition and mechanical properties of the amorphous hydrogenated boron carbide films based on response surface curves of FIG. 7A. As shown in 702, the boron-to-carbon ratio (B/C) ranges from 3.5 to 5 (representing a stoichiometry range of B3.5C to B5C) and is primarily dependent on growth temperature, increasing from ~3.5 at ~50~C to ~5 at ~250° C., before decreasing again to ~4.5 at ~450° C. As shown in 704, the atomic concentration of oxygen (at. % O) in these films remains relatively low, ranging from ~10% in the low temperature/power regime to <1% in the high temperature/power regime. As shown in 706, the atomic concentration of hydrogen (at. % H) ranges from ~10% to 45% and appears to be correlated nearly equally with both temperature and power, being at a maximum in the low temperature/power regime and at a minimum in the high temperature/power regime. As shown in 708, thin-film density ranges widely, from 0.9 to 2.3 g/cm3, with a response surface following a near inverse trend to that for at. % H, which is consistent with FIG. 5A discussed previously herein. A subset of predominantly low-density films was selected for PALS analysis to investigate porosity. Films with densities in the range of 0.9-1.8 g/cm3 exhibited pore sizes ranging from 0.69 to 0.40 nm in diameter and Ps intensities from 10% to 1.5%, yielding IV values of relative porosity that nominally correlate with film density. As shown in 710 and 712, the hardness (H) and Young's modulus (E) response surface curves trend as a function of growth temperature and power similarly to density. At low densities (<1.2 g/cm3), hardness ranges from 1 to 2 GPa and Young's modulus from 10 to 30 GPa, whereas for higher densities in the range of 1.3 to 2.3 g/cm3, hardness ranges from 5 to 25 GPa and Young's modulus from 100 to 350 GPa.

Figure 7B:
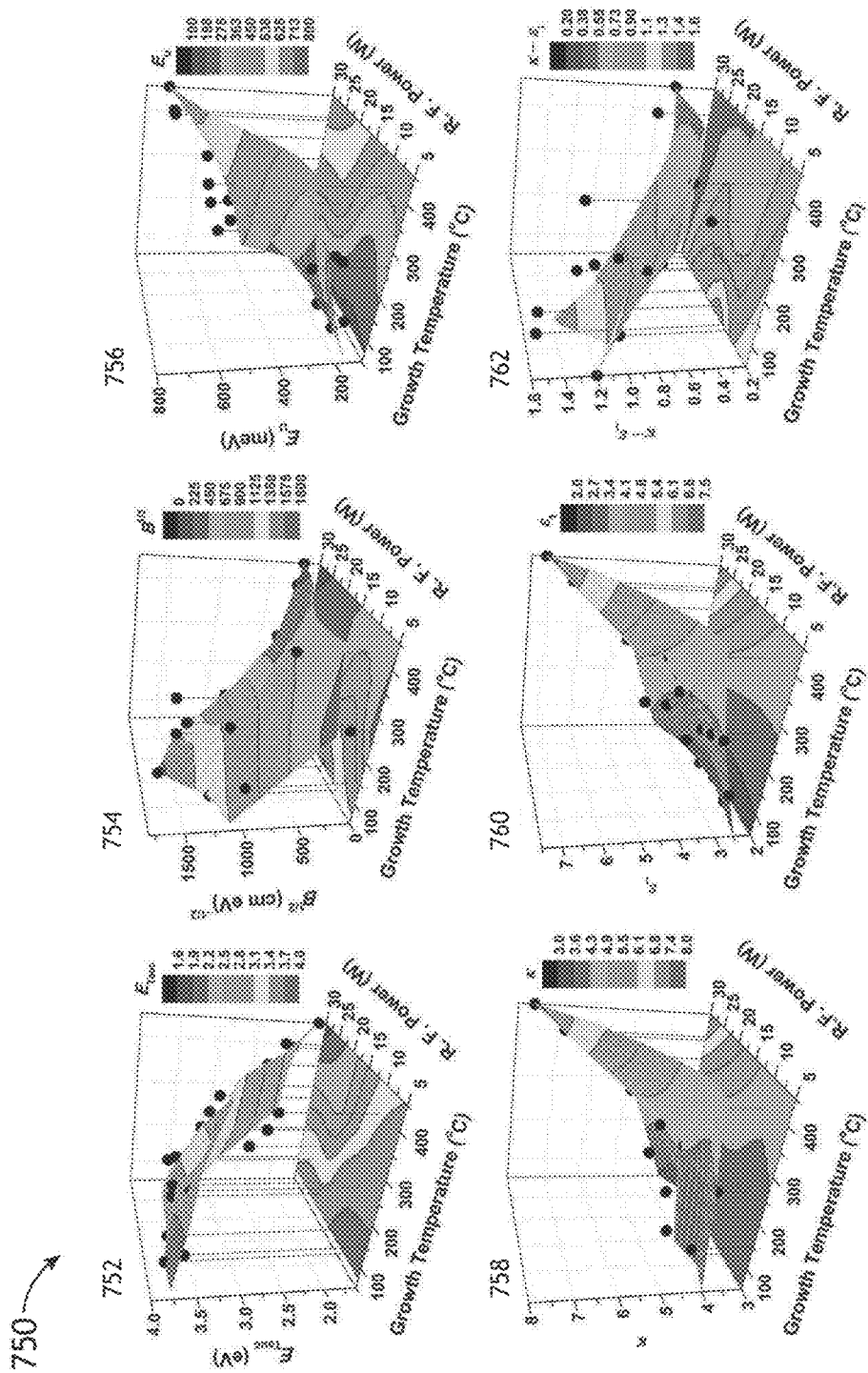
FIG. 7B illustrates a series of surface curves associated with electronic/optical and dielectric properties obtained from multiple amorphous hydrogenated boron carbide films as a function of film growth temperature and RF power used in the PECVD process, in accordance with one or more embodiments of the present disclosure.

FIG. 7B illustrates a series 750 of surface curves associated with electronic/optical and dielectric properties obtained from multiple amorphous hydrogenated boron carbide films as a function of film growth temperature and RF power used in the PECVD process. Surfaces 752, 754 and 756 display the response surfaces for Tauc band gap, Tauc slope parameter (in the form of $B^{1/2}$), and Urbach energy. The optical band gap ranges from 3.8 to 1.7 eV and $B^{1/2}$ from 1650 to 170 (cm eV)$^{-1/2}$, both decreasing as a function of temperature and power, while the Urbach energy exhibits the opposite behavior, increasing from 0.1 to 0.7 eV. It is noted that these three parameters display clear correlation. The response surfaces for the total dielectric constant, the electronic contribution to the dielectric constant, and the difference between the two (k–$\varepsilon_1$) for the series of amorphous hydrogenated boron carbide films are shown in surfaces 758, 760 and 762. The total dielectric constant ranges from 3.1 to 7.6, with the electronic contribution ranging from 2.3 to 7.1, both increasing with higher growth temperature and RF power.

Additional description on the influence of growth temperature and RF power on film properties is described in in Nordell, B. J. et al. The Influence of Hydrogen on the Chemical, Mechanical, Optical/Electronic, and Electrical Transport Properties of Amorphous Hydrogenated Boron Carbide. *J. Appl. Phys.* 118, 035703 (2015), which is incorporated above by reference in the entirety.

Figure 8A:
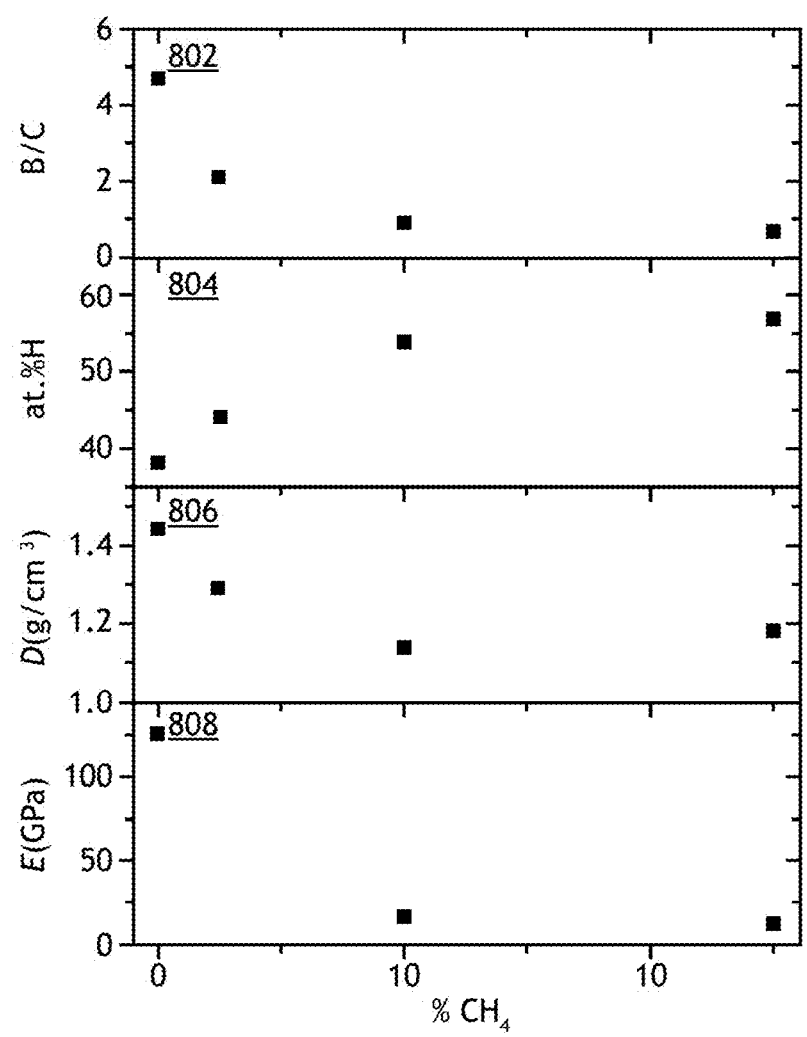
FIGS. 8A-8C illustrate various chemical, mechanic and dielectric properties acquired from a series of carbon-enriched amorphous hydrogenated boron carbide films as function of methane partial flow (% $CH_4$) used during fabrication of the films, in accordance with one or more embodiments of the present disclosure.
Figure 8B:
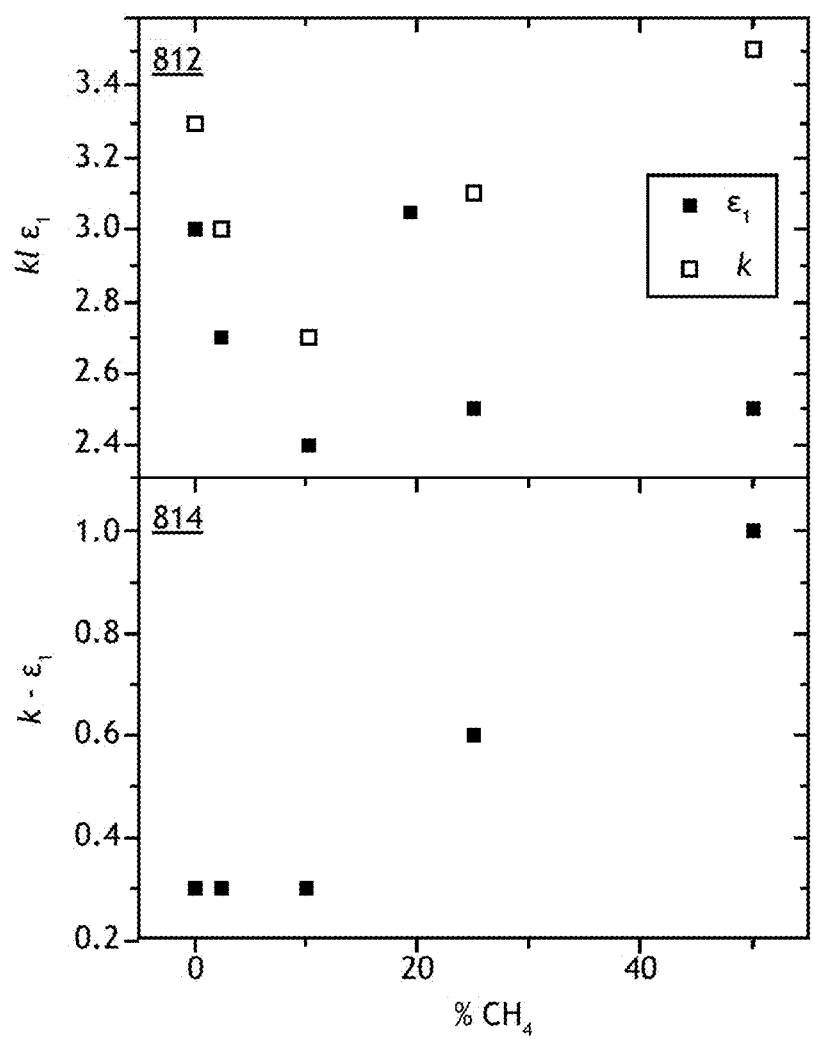
Figure 8C:
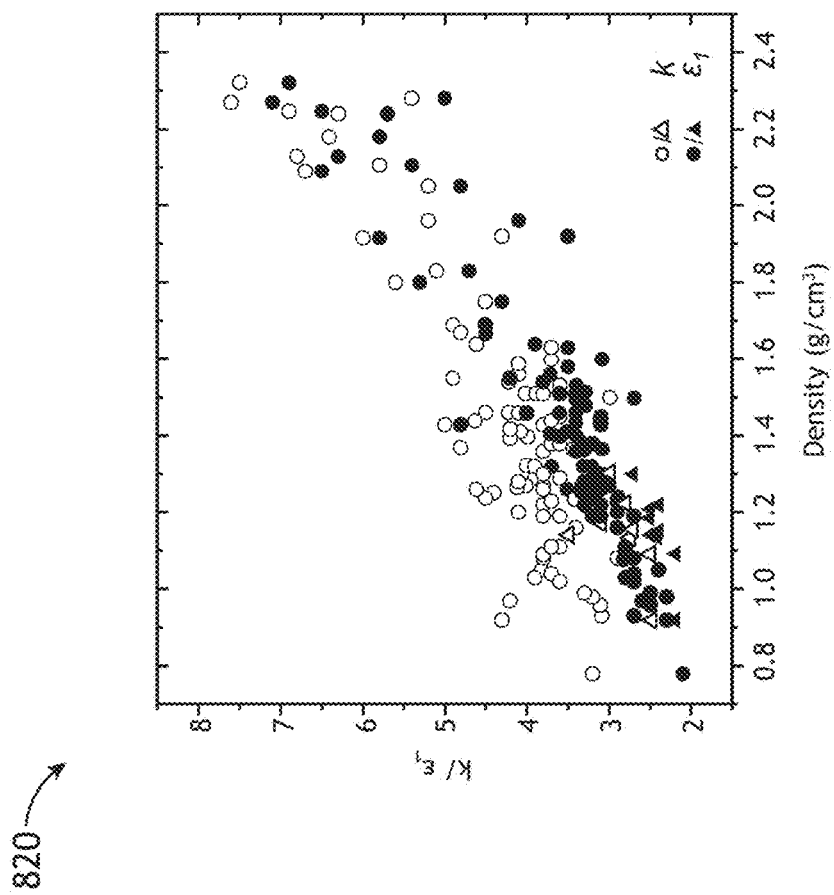

FIGS. 8A-8C illustrate various chemical, mechanic and dielectric properties acquired from a series of carbon-enriched amorphous hydrogenated boron carbide films as function of methane partial flow (% $CH_4$) used during fabrication of the films. The carbon-enriched films used to acquire the varies properties of FIGS. 8A-8C were grown at 250-275° C., 40 W RF power, 2 Torr and 200 sccm total carrier gas flow.

Graph 802 illustrates the boron-carbide ratio (B/C) as a function of the percentage of % $CH_4$. With the addition of $CH_4$ as a reactive plasma gas, the carbon content of the amorphous hydrogenated boron carbide films increases significantly, which corresponds to a decrease in the B/C ratio, as shown in graph 802. As shown in graph 804, the atomic concentration of hydrogen tracks the carbon content, indicating that carbon is being incorporated in the form of hydrocarbon, $CH_n$. As shown in graph 806, the increase in carbon is associated with a decrease in density, which suggests that the additional hydrocarbon contributes to increased free volume within the films. As shown in graph 808, the Young's modulus values of the films decrease as a function of increasing % $CH_4$.

FIG. 8B illustrates the high frequency ($10^{14}$ Hz) dielectric constant ($\varepsilon 1$), low frequency ($10^5$ Hz) dielectric constant (k) and (k–$\varepsilon 1$) as a function of the percentage of % $CH_4$. It is noted herein that films grown with added $CH_4$ tend to display lower dielectric constants than those grown without carbon-enrichment. Here, $\varepsilon_1$ decreases to 2.4-2.5 for films grown with ≥10% $CH_4$. While k decreases to a minimum value of 2.7 at 10% $CH_4$, it increases again with higher flow rates of $CH_4$. The observed change in $\varepsilon 1$ closely mirrors the observed changes in at. % H and density (see FIG. 8A). It is noted that the k–$\varepsilon 1$ term represents the sum of ionic and orientation polarization contributions. With the addition of CH4, Applicants were able to achieve low k–$\varepsilon 1$ values at much lower densities than in films without carbon-enrichment, and thus achieve much lower overall k values. This may be explained by the ability of the added carbon to facilitate bridging between icosahedra via CH2 groups (therefore rigidifying the lattice), in contrast to the unenriched films with minimal extraicosahedral C available and only large amounts of H to serve as one-fold network terminators.

FIG. 8C illustrates high frequency ($10^{14}$ Hz) dielectric constant ($\varepsilon 1$) and low frequency ($10^5$ Hz) for carbon-enriched and non-enriched amorphous hydrogenated boron carbide films as a function of density. It is noted that the open and closed circles represent high frequency and low frequency dielectric constant values for non-enriched films respectively, while open and closed triangles represent high frequency and low frequency dielectric constant values for carbon-enriched films respectively. As shown in FIG. 8C, the carbon-enriched films display much lower dielectric constant values at a given density than the non-enriched samples.

Table II below provides properties for amorphous hydrogenated boron carbide films (with and without carbon enrichment) compared to traditional ILD, ES/DB materials, hydrogenated SiOC and hydrogenated SiCN.

*Appl. Phys. Rev.* 2014, 1, 011306; S. W. King, Dielectric Barrier, Etch Stop, and Metal Capping Materials for State of the Art and beyond Metal Interconnects, *ECS J. Solid State Sci. Technol.* 2015, 4, N3029; W. Zhou, S. Bailey, R. Sooryakumar, S. King, G. Xu, E. Mays, C. Ege, J. Bielefeld, Elastic Properties of Porous Low-k Dielectric Nano-Films, *J. Appl. Phys.* 2011, 110, 043520; M. T. Alam, R. A. Pulavarthy, J. Bielefeld, S. W. King, M. A. Hague, Thermal Conductivity Measurement of Low-k Dielectric Films: Effect of Porosity and Density, *J. Electron. Mater.* 2013, 43, 746; T. A. Pomorski, B. C. Bittel, P. M. Lenahan, E. Mays, C. Ege, J. Bielefeld, D. Michalak, S. W. King, Defect Structure and Electronic Properties of SiOC:H Films Used for Back End of the Line Dielectrics, *J. Appl. Phys.* 2014, 115, 234508; K. Vanstreels, C. Wu, M. R. Baklanov, Mechanical Stability of Porous Low-k Dielectrics, *ECS J. Solid State Sci. Technol.* 2014, 4, N3058; S. W. King, D. Jacob, D. Vanleuven, B. Colvin, J. Kelly, M. French, J. Bielefeld, D. Dutta, M. Liu, D. Gidley, Film Property Requirements for Hermetic Low-k a-SiO$_x$C$_y$N$_z$:H Dielectric Barriers, *ECS J. Solid State Sci. Technol.* 2012, 1, N115; and Y. L. Cheng, J. Wu, T.-J. Chiu, S.-A. Chen, Y.-L. Wang, Comprehensive comparison of electrical and reliability characteristics of various copper barrier films, *J. Vac. Sci. Technol. B Microelectron. Nanom. Struct.* 2011, 29, 031207, which are each incorporated herein by reference in the entirety.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can

TABLE 2

|  | SiOC:H | SiCN:H | BC:H | BC:H (C-enriched) |
|---|---|---|---|---|
| Use | ILD | ES/DB | ILD/ES/DB | ILD |
| Dielectric constant (k) | 2.2-3.2 | 4.8-5.8 | 3.3 ± 0.16 | 2.5 |
| Density (g/cm$^3$) | 0.9-1.3 | 1.7-2.2 | 1.4 ± 0.08 | 1.0 ± 0.1 |
| Pore diameter (nm) | 1-1.3 | 0.5-0.6 | ≤0.7 | 0.7 |
| Young's modulus (GPa) | 3-10 | 40-100 | 126 ± 5 | 12 ± 3 |
| Leakage current at 2 MV/cm (A/cm$^2$) | $10^{-8}$-$10^{-9}$ | $10^{-7}$-$10^{-8}$ | $1 \times 10^{-8}$ (±6 × $10^{-9}$) | $1 \times 10^{-8}$ |
| Breakdown voltage (MV/cm) | >6 | 4-6 | >5 | >5 |
| Adhesion energy (J/m$^2$) | 2-5[a] | — | 8.6 ± 3.3 | — |
| Stress (MPa) | [a] | [a] | −400 ± 100 | — |
| Thermal conductivity (W m$^{-1}$K$^{-1}$) | 0.01-0.4 | 0.6-0.8 | 0.49 ± 0.04 | 0.31 ± 0.03 |
| Coefficient of thermal expansion (ppm/° C.) | 10-20 | ~5 | 20 ± 4 | — |
| ILD plasma (CHF$_3$) etch rate (Å/s) | 4-15 | 3-9 | 3-15 | 5-20 |
| ES plasma (CF$_4$/O$_2$) etch rate (Å/s) | 3-12 | 20-60 | 60-180 | ≥100 |

As shown in Table II the unenriched and carbon-enriched amorphous hydrogenated boron carbide films display properties that make them a competitive alternative to SiOC:H an SiCN:H films in the use of various interconnect device structures. Values for SiOC:H and SiCN:H are found in the following: A. Grill, S. M. Gates, T. E. Ryan, S. V. Nguyen, D. Priyadarshini, Progress in the development and understanding of advanced low k and ultralow k dielectrics for very large-scale integrated interconnects—State of the art, also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components.

In some instances, one or more components may be referred to herein as "configured to," "configurable to,"

"operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B.

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed:

1. A method comprising:
    positioning the substrate within a plasma enhanced chemical vapor deposition (PECVD) chamber;
    providing an ortho-carborane precursor;
    passing a carrier gas through the ortho-carborane precursor, wherein the carrier gas uptakes at least a portion of the ortho-carborane precursor, wherein the carrier gas passed through the ortho-carborane precursor is provided at a partial flow rate of 90 to 97.5% of a total flow rate;
    providing methane at a partial flow rate of 2.5 to 10% of the total flow rate;
    introducing the methane and the carrier gas passed through the ortho-carborane precursor into the PECVD chamber to form a methane-ortho-carborane mixture;
    applying radio frequency power within the PECVD chamber to the carrier gas-methane-ortho-carborane mixture to form one or more plasmas containing one or more species containing at least one of boron, carbon or hydrogen; and
    depositing amorphous hydrogenated boron carbide to form a layer of an interconnect device structure of an electronic device, wherein the introduction of methane at a partial flow rate of 2.5 to 10% provides sufficient bond termination and network bridging to establish a carbon level between 10 and 20% by atomic weight, a dielectric constant (k), measured at $1 \times 10^6$ Hz, between approximately 2.5 and 2.7, a density between approximately 0.8 and 1.3 g/cm$^3$, and a leakage current density (J) between $1 \times 10^{-9}$ and $1 \times 10^{-7}$ A/cm$^2$, measured at 2 MV/cm, in the layer of the interconnect device structure;
    wherein the temperature of the substrate is maintained between approximately 175 and 275° C. during the depositing of the amorphous hydrogenated boron carbide.

2. The method of claim 1, wherein the ortho-carborane precursor comprises:
    a solid ortho-carborane precursor.

3. The method of claim 1, wherein the ortho-carborane precursor comprises:
    one or more liquid ortho-carborane precursors.

4. The method of claim 1, wherein the one or more species containing at least one of boron, carbon or hydrogen comprise:
    one or more free radicals containing at least one of boron, carbon or hydrogen.

5. The method of claim 1, wherein the one or more species containing at least one of boron, carbon or hydrogen comprise:
one or more ions containing at least one of boron, carbon or hydrogen.

6. The method of claim 1, wherein the pressure within the PECVD chamber is maintained between approximately 0.2 and 760 Torr.

7. The method of claim 1, wherein the layer of the interconnect device structure has a Young's modulus between approximately 7 and 16 GPa.

8. The method of claim 1, wherein the layer of the interconnect device structure has a resistivity between $10^{13}$ and $10^{14}$ ohm-cm.

9. The method of claim 1, wherein the layer of the interconnect device structure includes, by atomic weight, 20-40% boron, 10-20% carbon and 40-55% hydrogen.

10. The method of claim 1, wherein the electronic device comprises:
at least one of a microprocessor device, an application specific integrated circuit device, or a flash memory device.

11. The method of claim 1, wherein a bulk structure of the deposited amorphous hydrogenated boron carbide comprises a plurality of hydrogenated carborane icosahedra.

12. The method of claim 11, wherein the bulk structure of the deposited amorphous hydrogenated boron carbide comprises a plurality of pores of a diameter between 0.4 and 0.7 nm.

13. A method of forming an amorphous hydrogenated boron carbide film on a substrate comprising:
positioning the substrate within a plasma enhanced chemical vapor deposition (PECVD) chamber;
providing an ortho-carborane precursor;
passing a carrier gas through the ortho-carborane precursor, wherein the carrier gas uptakes at least a portion of the ortho-carborane precursor, wherein the carrier gas passed through the ortho-carborane precursor is provided at a partial flow rate of 90 to 97.5% of a total flow rate;
providing methane at a partial flow rate of 2.5 to 10% of the total flow rate;
introducing the methane and the carrier gas passed through the ortho-carborane precursor into the PECVD chamber to form a methane-ortho-carborane mixture;
applying radio frequency power within the PECVD chamber to the carrier gas-methane-ortho-carborane mixture to form one or more plasmas containing one or more species containing at least one of boron, carbon or hydrogen;
depositing amorphous hydrogenated boron carbide to form a first layer of an interconnect device structure of an electronic device, wherein the introduction of methane at a partial flow rate of 2.5 to 10% provides sufficient bond termination and network bridging to establish a carbon level between 10 and 20% by atomic weight, a dielectric constant (k), measured at $1\times10^6$ Hz, between approximately 2.5 and 2.7, a density between approximately 0.8 and 1.3 g/cm$^3$, and a leakage current density (J) between $1\times10^{-9}$ to $1\times10^{-7}$ A/cm$^2$, measured at 2 MV/cm, in the first layer of the interconnect device structure;
depositing amorphous hydrogenated boron carbide to form a dielectric diffusion barrier (DDB) above the first layer of the interconnect device structure of the electronic device, wherein the DDB has a carbon level between 10 and 20% by atomic weight; and
depositing amorphous hydrogenated boron carbide to form an additional layer of the interconnect device structure of the electronic device, wherein the additional layer of the interconnect device structure has a carbon level between approximately 10 and 20% by atomic weight, and a dielectric constant (k), measured at $1\times10^6$ Hz, between approximately 2.5 and 2.7;
wherein the temperature of the substrate is maintained between approximately 175 and 275° C. during each of the depositions of the amorphous hydrogenated boron carbide.

14. A method comprising:
positioning the substrate within a plasma enhanced chemical vapor deposition (PECVD) chamber;
providing an ortho-carborane precursor;
passing a carrier gas through the ortho-carborane precursor, wherein the carrier gas uptakes at least a portion of the ortho-carborane precursor, wherein the carrier gas passed through the ortho-carborane precursor is provided at a partial flow rate of 90 to 97.5% of a total flow rate;
providing methane at a partial flow rate of 2.5 to 10% of the total flow rate;
introducing the methane and the carrier gas passed through the ortho-carborane precursor into the PECVD chamber to form a methane-ortho-carborane mixture;
applying radio frequency power within the PECVD chamber to the carrier gas-methane-ortho-carborane mixture to form one or more plasmas containing one or more species containing at least one of boron, carbon or hydrogen;
depositing amorphous hydrogenated boron carbide to form a first layer of an interconnect device structure of an electronic device, wherein the introduction of methane at a partial flow rate of 2.5 to 10% provides sufficient bond termination and network bridging to establish a carbon level between 10 and 20% by atomic weight, a dielectric constant (k), measured at $1\times10^6$ Hz, between approximately 2.5 and 2.7, a density between approximately 0.8 and 1.3 g/cm$^3$, and a leakage current density (J) between $1\times10^{-9}$ and $1\times10^{-7}$ A/cm$^2$, measured at 2 MV/cm, in the first layer of the interconnect device structure;
depositing amorphous hydrogenated boron carbide to form an etch stop layer (ESL) above the first layer of the interconnect device structure in order to protect the first layer of the interconnect device structure from one or more etch processes, wherein the ESL has a carbon level between 10 and 20% by atomic weight;
depositing amorphous hydrogenated boron carbide to form an additional layer of the interconnect device structure, wherein the additional layer of the interconnect device structure has a carbon level between approximately 10 to 20% by atomic weight, and a dielectric constant (k), measured at $1\times10^6$ Hz, between approximately 2.5 and 2.7; and
forming one or more vias in the additional layer of the interconnect device structure using one or more etch processes,
wherein the temperature of the substrate is maintained between approximately 175 and 275° C. during each of the depositions of the amorphous hydrogenated boron carbide.

* * * * *